United States Patent
Savandaiah et al.

(10) Patent No.: US 12,080,571 B2
(45) Date of Patent: Sep. 3, 2024

(54) SUBSTRATE PROCESSING MODULE AND METHOD OF MOVING A WORKPIECE

(71) Applicant: Applied Materials, Inc., Santa Clara, CA (US)

(72) Inventors: Kirankumar Neelasandra Savandaiah, Bangalore (IN); Srinivasa Rao Yedla, Bangalore (IN); Thomas Brezoczky, Los Gatos, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 606 days.

(21) Appl. No.: 16/923,792

(22) Filed: Jul. 8, 2020

(65) Prior Publication Data

US 2022/0013383 A1    Jan. 13, 2022

(51) Int. Cl.
| | |
|---|---|
| H01L 21/67 | (2006.01) |
| C23C 14/35 | (2006.01) |
| H01L 21/677 | (2006.01) |
| H01L 21/687 | (2006.01) |

(52) U.S. Cl.
CPC ........ *H01L 21/67184* (2013.01); *C23C 14/35* (2013.01); *H01L 21/67167* (2013.01); *H01L 21/67196* (2013.01); *H01L 21/67742* (2013.01); *H01L 21/67766* (2013.01); *H01L 21/68707* (2013.01)

(58) Field of Classification Search
None
See application file for complete search history.

(56) References Cited

U.S. PATENT DOCUMENTS

| | | | |
|---|---|---|---|
| 5,556,147 A | * | 9/1996 | Somekh .............. H01L 21/6838 294/185 |
| 5,863,170 A | | 1/1999 | Boitnott et al. |
| 5,879,459 A | | 3/1999 | Gadgil et al. |

(Continued)

FOREIGN PATENT DOCUMENTS

| | | |
|---|---|---|
| CN | 100411095 C | 8/2008 |
| CN | 102965643 B | 2/2016 |

(Continued)

OTHER PUBLICATIONS

International Search Report and Written Opinion dated Sep. 4, 2020 for Application No. PCT/US2020/033456.

(Continued)

*Primary Examiner* — Jason Berman
(74) *Attorney, Agent, or Firm* — Patterson + Sheridan, LLP

(57) ABSTRACT

Embodiments disclosed herein include a substrate processing module and a method of moving a workpiece. The substrate processing module includes a shutter stack and two process stations. The shutter stack is disposed between the process stations. The method of moving a workpiece includes moving a supporting portion from a first location to a shutter stack in a first direction, retrieving the workpiece from the shutter stack, and moving the supporting portion to a second location. The transfer chamber assembly and method allows for moving workpieces to and from the shutter stack to the two process stations. A central transfer robot of the substrate processing module is configured to grip both substrates and shutter discs, allowing for one robot when typically two robots would be required.

9 Claims, 23 Drawing Sheets

(56) References Cited

U.S. PATENT DOCUMENTS

| | | | |
|---|---|---|---|
| 6,071,055 A * | 6/2000 | Tepman | H01L 21/67742 |
| | | | 414/217 |
| 6,162,299 A | 12/2000 | Raaijmakers | |
| 6,440,261 B1 | 8/2002 | Tepman et al. | |
| 6,447,607 B2 | 9/2002 | Soininen et al. | |
| 6,530,732 B1 | 3/2003 | Theriault et al. | |
| 6,576,062 B2 | 6/2003 | Matsuse | |
| 6,604,853 B2 | 8/2003 | Chao et al. | |
| 6,635,115 B1 | 10/2003 | Fairbairn et al. | |
| 6,852,194 B2 | 2/2005 | Matsushita et al. | |
| 6,962,471 B2 | 11/2005 | Birkner et al. | |
| 7,066,703 B2 | 6/2006 | Johnson | |
| 7,090,741 B2 | 8/2006 | Narushima et al. | |
| D527,751 S | 9/2006 | Kondoh et al. | |
| 7,138,336 B2 | 11/2006 | Lee et al. | |
| 7,169,234 B2 | 1/2007 | Weeks et al. | |
| 7,189,432 B2 | 3/2007 | Chiang et al. | |
| 7,258,768 B2 | 8/2007 | Yamazaki | |
| 7,318,869 B2 | 1/2008 | Chiang et al. | |
| 7,422,406 B2 | 9/2008 | van der Meulen | |
| 7,458,763 B2 | 12/2008 | van der Meulen | |
| 7,537,662 B2 | 5/2009 | Soininen et al. | |
| 7,784,164 B2 | 8/2010 | White et al. | |
| 7,799,179 B2 | 9/2010 | Maass et al. | |
| 7,806,983 B2 | 10/2010 | Chiang et al. | |
| 7,833,352 B2 | 11/2010 | Bondestam et al. | |
| 7,905,991 B2 | 3/2011 | Esselbach et al. | |
| 7,959,403 B2 | 6/2011 | van der Meulen | |
| 7,988,399 B2 | 8/2011 | van der Meulen | |
| 8,029,226 B2 | 10/2011 | van der Meulen | |
| 8,033,772 B2 | 10/2011 | Kurita et al. | |
| 8,088,678 B2 | 1/2012 | Kitano et al. | |
| 8,197,177 B2 | 6/2012 | van der Meulen et al. | |
| 8,216,380 B2 | 7/2012 | White et al. | |
| 8,267,632 B2 | 9/2012 | van der Meulen et al. | |
| 8,292,563 B2 | 10/2012 | Haris | |
| 8,313,277 B2 | 11/2012 | van der Meulen et al. | |
| 8,354,656 B2 | 1/2013 | Beloussov et al. | |
| 8,403,613 B2 | 3/2013 | van der Meulen | |
| 8,434,989 B2 | 5/2013 | van der Meulen | |
| 8,439,623 B2 | 5/2013 | van der Meulen | |
| 8,500,388 B2 | 8/2013 | van der Meulen et al. | |
| 8,523,507 B2 | 9/2013 | van der Meulen | |
| 8,558,299 B2 | 10/2013 | Cao et al. | |
| 8,574,409 B2 | 11/2013 | Kadlec et al. | |
| 8,602,716 B2 | 12/2013 | van der Meulen et al. | |
| 8,672,605 B2 | 3/2014 | van der Meulen et al. | |
| 8,696,298 B2 | 4/2014 | van der Meulen et al. | |
| 8,728,239 B2 | 5/2014 | Bauer et al. | |
| 8,807,075 B2 | 8/2014 | Brown | |
| 8,807,905 B2 | 8/2014 | Meulen | |
| 8,812,150 B2 | 8/2014 | van der Meulen et al. | |
| 8,870,513 B2 | 10/2014 | Voser et al. | |
| 8,870,514 B2 | 10/2014 | van der Meulen et al. | |
| 8,895,450 B2 | 11/2014 | Cao et al. | |
| 8,944,738 B2 | 2/2015 | van der Meulen | |
| 8,945,308 B2 | 2/2015 | Schaller | |
| 9,005,539 B2 | 4/2015 | Halpin et al. | |
| 9,085,825 B2 | 7/2015 | Kim | |
| 9,103,030 B2 | 8/2015 | Kato et al. | |
| 9,214,589 B2 | 12/2015 | Voser et al. | |
| 9,252,037 B2 | 2/2016 | Scholte Von Mast et al. | |
| 9,281,222 B2 | 3/2016 | Weaver et al. | |
| 9,336,997 B2 | 5/2016 | Bera | |
| 9,340,874 B2 | 5/2016 | Halpin et al. | |
| 9,347,131 B2 | 5/2016 | Maass et al. | |
| 9,355,824 B2 | 5/2016 | Kadlec et al. | |
| 9,378,994 B2 | 6/2016 | Weaver et al. | |
| 9,396,981 B2 | 7/2016 | Scholte Von Mast et al. | |
| 9,443,749 B2 | 9/2016 | Wakabayashi et al. | |
| 9,478,420 B2 | 10/2016 | Castaldi et al. | |
| 9,490,149 B2 | 11/2016 | Chandrasekharan et al. | |
| 9,551,068 B2 | 1/2017 | Kumagai et al. | |
| 9,583,349 B2 | 2/2017 | Gandikota et al. | |
| 9,587,306 B2 | 3/2017 | Rohrmann et al. | |
| 9,644,261 B2 | 5/2017 | Weichart et al. | |
| 9,698,009 B2 | 7/2017 | Sato et al. | |
| 9,831,094 B2 | 11/2017 | Rahtu et al. | |
| 9,842,755 B2 | 12/2017 | Ocker et al. | |
| 9,884,726 B2 | 2/2018 | van der Meulen et al. | |
| 9,890,473 B2 | 2/2018 | Newman | |
| 9,929,008 B2 | 3/2018 | Wamura et al. | |
| 9,932,674 B2 | 4/2018 | Kato et al. | |
| 9,953,843 B2 | 4/2018 | Shen et al. | |
| 9,960,072 B2 | 5/2018 | Coomer | |
| 10,043,693 B1 | 8/2018 | Kim et al. | |
| 10,086,511 B2 | 10/2018 | van der Meulen | |
| 10,138,553 B2 | 11/2018 | Scholte Von Mast et al. | |
| 10,145,014 B2 | 12/2018 | Nozawa et al. | |
| 10,202,682 B2 | 2/2019 | Rieschl et al. | |
| 10,202,687 B2 | 2/2019 | Miura et al. | |
| 10,221,480 B2 | 3/2019 | Kato et al. | |
| 10,256,125 B2 | 4/2019 | Weaver et al. | |
| 10,262,888 B2 | 4/2019 | Gangakhedkar et al. | |
| 10,347,515 B2 | 7/2019 | Heinz | |
| 10,388,559 B2 | 8/2019 | Rieschl et al. | |
| 10,427,303 B2 | 10/2019 | Weaver et al. | |
| 10,500,719 B2 | 12/2019 | Muthukamatchi et al. | |
| 10,586,720 B2 | 3/2020 | Weaver et al. | |
| 10,814,475 B2 | 10/2020 | Muthukamatchi et al. | |
| 10,850,390 B2 | 12/2020 | Muthukamatchi et al. | |
| 2002/0051698 A1 | 5/2002 | Birkner et al. | |
| 2002/0108842 A1 | 8/2002 | Bonora et al. | |
| 2002/0170671 A1 | 11/2002 | Matsushita et al. | |
| 2003/0109094 A1 | 6/2003 | Seidel et al. | |
| 2004/0159553 A1 | 8/2004 | Nogami et al. | |
| 2004/0261710 A1 | 12/2004 | Matsushita et al. | |
| 2005/0005850 A1 | 1/2005 | Yamazaki | |
| 2005/0006230 A1 | 1/2005 | Narushima et al. | |
| 2005/0111936 A1 | 5/2005 | Kim et al. | |
| 2005/0115822 A1 | 6/2005 | Maass et al. | |
| 2005/0118009 A1 | 6/2005 | van der Meulen | |
| 2006/0005767 A1 | 1/2006 | Tsai et al. | |
| 2006/0051507 A1 | 3/2006 | Kurita et al. | |
| 2006/0056952 A1 | 3/2006 | Haris | |
| 2006/0101728 A1 | 5/2006 | White et al. | |
| 2006/0137608 A1 | 6/2006 | Choi et al. | |
| 2006/0137609 A1 | 6/2006 | Puchacz et al. | |
| 2006/0157340 A1 | 7/2006 | Kurita et al. | |
| 2006/0188742 A1 | 8/2006 | West et al. | |
| 2006/0201074 A1 | 9/2006 | Kurita et al. | |
| 2006/0263177 A1 | 11/2006 | Meulen | |
| 2007/0020890 A1 | 1/2007 | Thakur et al. | |
| 2007/0215036 A1 | 9/2007 | Park et al. | |
| 2007/0281090 A1 | 12/2007 | Kurita et al. | |
| 2008/0014055 A1 | 1/2008 | van der Meulen | |
| 2008/0072821 A1 | 3/2008 | Dalton et al. | |
| 2008/0124194 A1 | 5/2008 | van der Meulen et al. | |
| 2008/0124197 A1 | 5/2008 | van der Meulen et al. | |
| 2008/0138176 A1 | 6/2008 | Kim et al. | |
| 2008/0187417 A1 | 8/2008 | van der Meulen et al. | |
| 2008/0219808 A1 | 9/2008 | van der Meulen et al. | |
| 2008/0219812 A1 | 9/2008 | van der Meulen et al. | |
| 2008/0226429 A1 | 9/2008 | van der Meulen | |
| 2008/0232947 A1 | 9/2008 | van der Meulen et al. | |
| 2008/0276867 A1 * | 11/2008 | Schaller | H01L 21/67173 |
| | | | 118/719 |
| 2009/0087286 A1 | 4/2009 | Meulen | |
| 2009/0173622 A1 | 7/2009 | Weichart et al. | |
| 2009/0180847 A1 | 7/2009 | Guo et al. | |
| 2010/0012036 A1 | 1/2010 | Silva et al. | |
| 2010/0075453 A1 | 3/2010 | Kurita et al. | |
| 2010/0120238 A1 | 5/2010 | Kitano et al. | |
| 2010/0202860 A1 | 8/2010 | Reed et al. | |
| 2010/0236691 A1 | 9/2010 | Yamazaki | |
| 2010/0281683 A1 | 11/2010 | White et al. | |
| 2010/0304027 A1 | 12/2010 | Lee et al. | |
| 2010/0327187 A1 | 12/2010 | Beloussov et al. | |
| 2012/0027542 A1 | 2/2012 | Somura et al. | |
| 2012/0031749 A1 | 2/2012 | Dubs et al. | |
| 2012/0328797 A1 | 12/2012 | Maass et al. | |
| 2013/0270107 A1 | 10/2013 | Ewert et al. | |
| 2013/0302115 A1 | 11/2013 | Wakabayashi et al. | |
| 2014/0262035 A1 | 9/2014 | Merry et al. | |

(56) References Cited

U.S. PATENT DOCUMENTS

| | | |
|---|---|---|
| 2014/0349011 A1 | 11/2014 | Weichart |
| 2015/0063957 A1 | 3/2015 | Olgado |
| 2015/0240360 A1 | 8/2015 | Leeser |
| 2016/0108515 A1 | 4/2016 | Elghazzali et al. |
| 2016/0138159 A1 | 5/2016 | Kato et al. |
| 2017/0175247 A1 | 6/2017 | Weichart |
| 2017/0218514 A1 | 8/2017 | Kato et al. |
| 2017/0368680 A1 | 12/2017 | Muthukamatchi et al. |
| 2018/0142350 A1 | 5/2018 | Fukiage et al. |
| 2018/0195173 A1 | 7/2018 | Kato et al. |
| 2018/0211820 A1 | 7/2018 | Krishna et al. |
| 2018/0226228 A1 | 8/2018 | Toyoda et al. |
| 2018/0245212 A1 | 8/2018 | Schwyn-Thony et al. |
| 2018/0245218 A1 | 8/2018 | Kato |
| 2018/0261473 A1 | 9/2018 | Weichart et al. |
| 2018/0308737 A1 | 10/2018 | Moriya et al. |
| 2018/0334745 A1 | 11/2018 | Kato |
| 2019/0013225 A1 | 1/2019 | Taguchi et al. |
| 2019/0096715 A1 | 3/2019 | Lodder et al. |
| 2019/0252160 A1 | 8/2019 | Balon et al. |
| 2019/0252166 A1 | 8/2019 | Felzer et al. |
| 2019/0270196 A1 | 9/2019 | Muthukamatchi et al. |
| 2019/0348264 A1 | 11/2019 | Tsai et al. |
| 2020/0061805 A1 | 2/2020 | Muthukamatchi et al. |
| 2021/0118653 A1 | 4/2021 | Shinada et al. |
| 2021/0354934 A1 | 11/2021 | Aust et al. |
| 2021/0358780 A1 | 11/2021 | Mori |
| 2022/0208426 A1 | 6/2022 | Aust et al. |

FOREIGN PATENT DOCUMENTS

| | | |
|---|---|---|
| CN | 105200393 B | 10/2018 |
| CN | 111312613 A | 6/2020 |
| DE | 10350517 A1 | 6/2005 |
| DE | 102012103295 A1 | 7/2013 |
| DE | 102013111790 A1 | 4/2015 |
| DE | 102013113052 A1 | 5/2015 |
| EP | 2102889 A2 | 9/2009 |
| JP | H0963959 A | 3/1997 |
| JP | H11163075 A | 6/1999 |
| JP | 2007107047 A | 4/2007 |
| JP | 5088284 B2 | 12/2012 |
| JP | 5315898 B2 | 10/2013 |
| JP | 5544697 B2 | 7/2014 |
| JP | 5870568 B2 | 3/2016 |
| JP | 2017079329 A | 4/2017 |
| JP | 6330623 B2 | 5/2018 |
| JP | 6464765 B2 | 2/2019 |
| JP | 6478847 B2 | 3/2019 |
| JP | 2019036630 A | 3/2019 |
| KR | 101887072 B1 | 8/2018 |
| KR | 20190030415 A | 3/2019 |
| KR | 20220099611 A | 7/2022 |
| TW | 440913 B | 6/2001 |
| TW | 201526148 A | 7/2015 |
| TW | 201946217 A | 12/2019 |
| WO | 0137317 A1 | 5/2001 |
| WO | 201033904 A2 | 3/2010 |
| WO | 2017212077 A2 | 12/2017 |
| WO | 2018197305 A2 | 11/2018 |
| WO | 2019020391 A1 | 1/2019 |
| WO | 2019020393 A1 | 1/2019 |
| WO | 2019052657 A1 | 3/2019 |
| WO | 2019096515 A1 | 5/2019 |
| WO | 2019096564 A1 | 5/2019 |
| WO | 2019105671 A1 | 6/2019 |
| WO | 2019208035 A1 | 10/2019 |

OTHER PUBLICATIONS

International Search Report and Written Opinion dated Jul. 16, 2021 for Application No. PCT/US2021/026712.
PCT International Search Report and Written Opinion dated Jul. 23, 2021, for International Application No. PCT/US2021/026701.
Taiwan Office Action dated Jan. 16, 2024 for Application No. 110114031.
Taiwan Office Action dated Aug. 2, 2023, for TW Application No. 110114031.
Japanese Office Action dated May 1, 2024 for Application No. 2023-501062.

\* cited by examiner

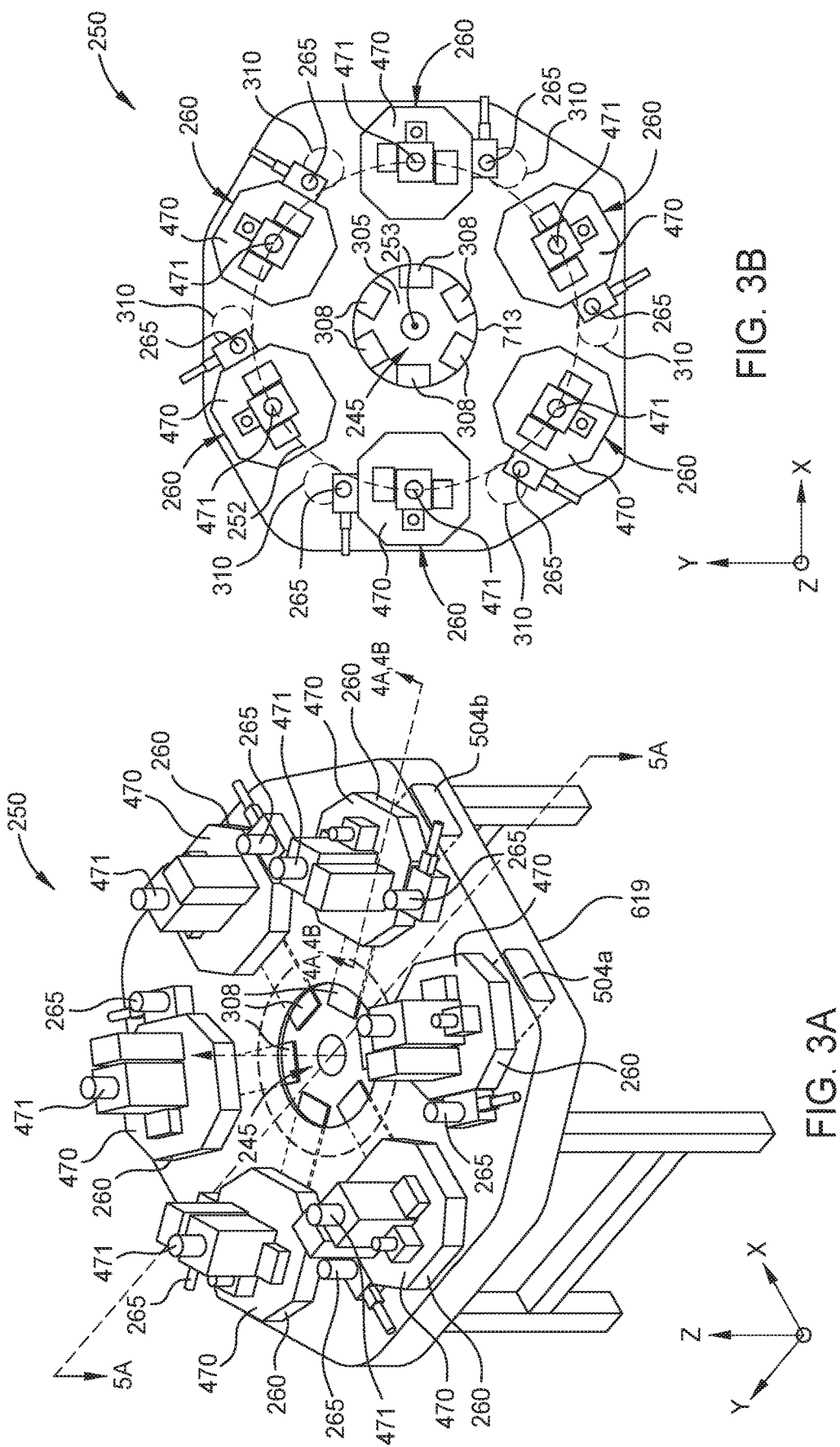

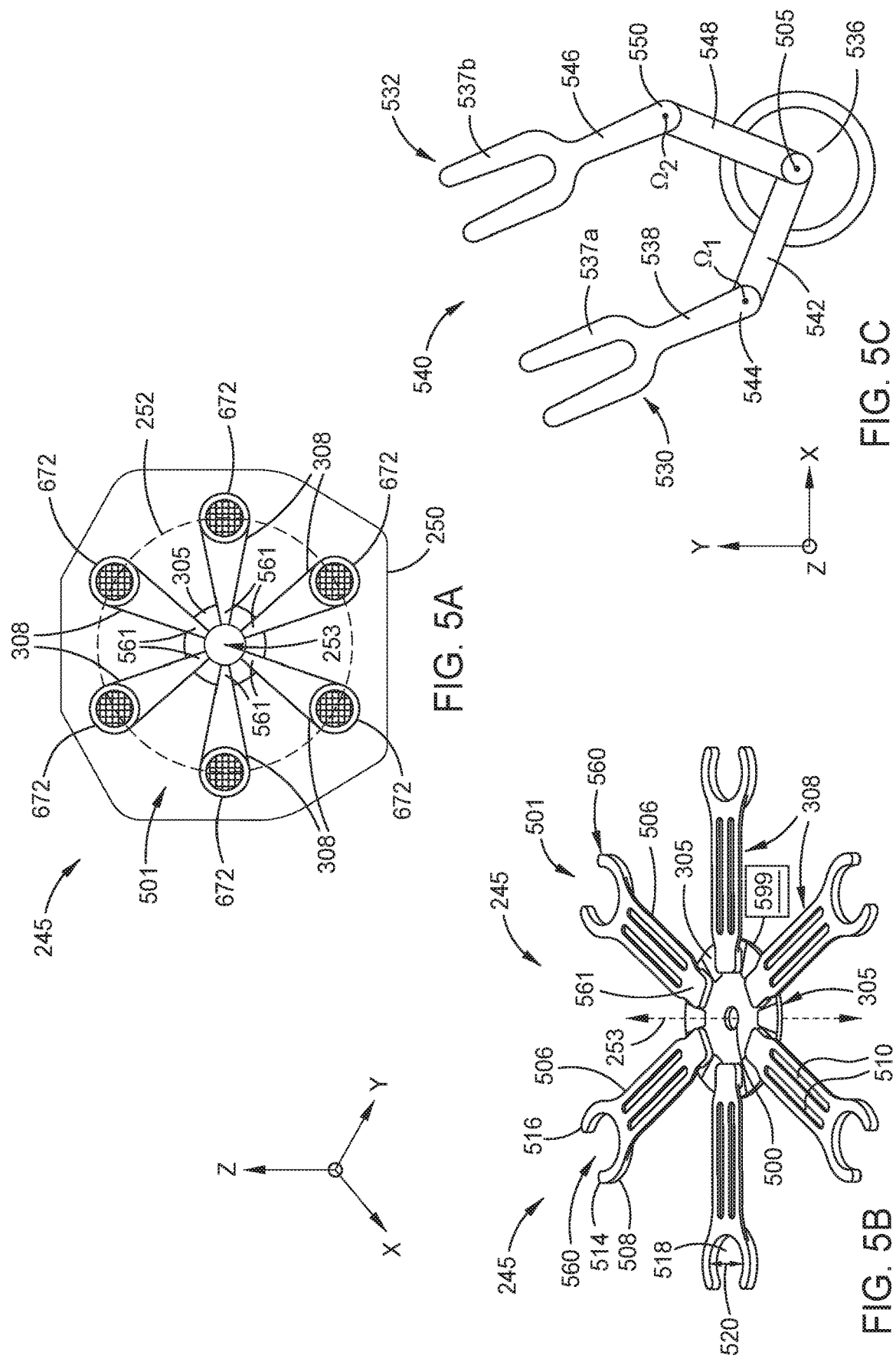

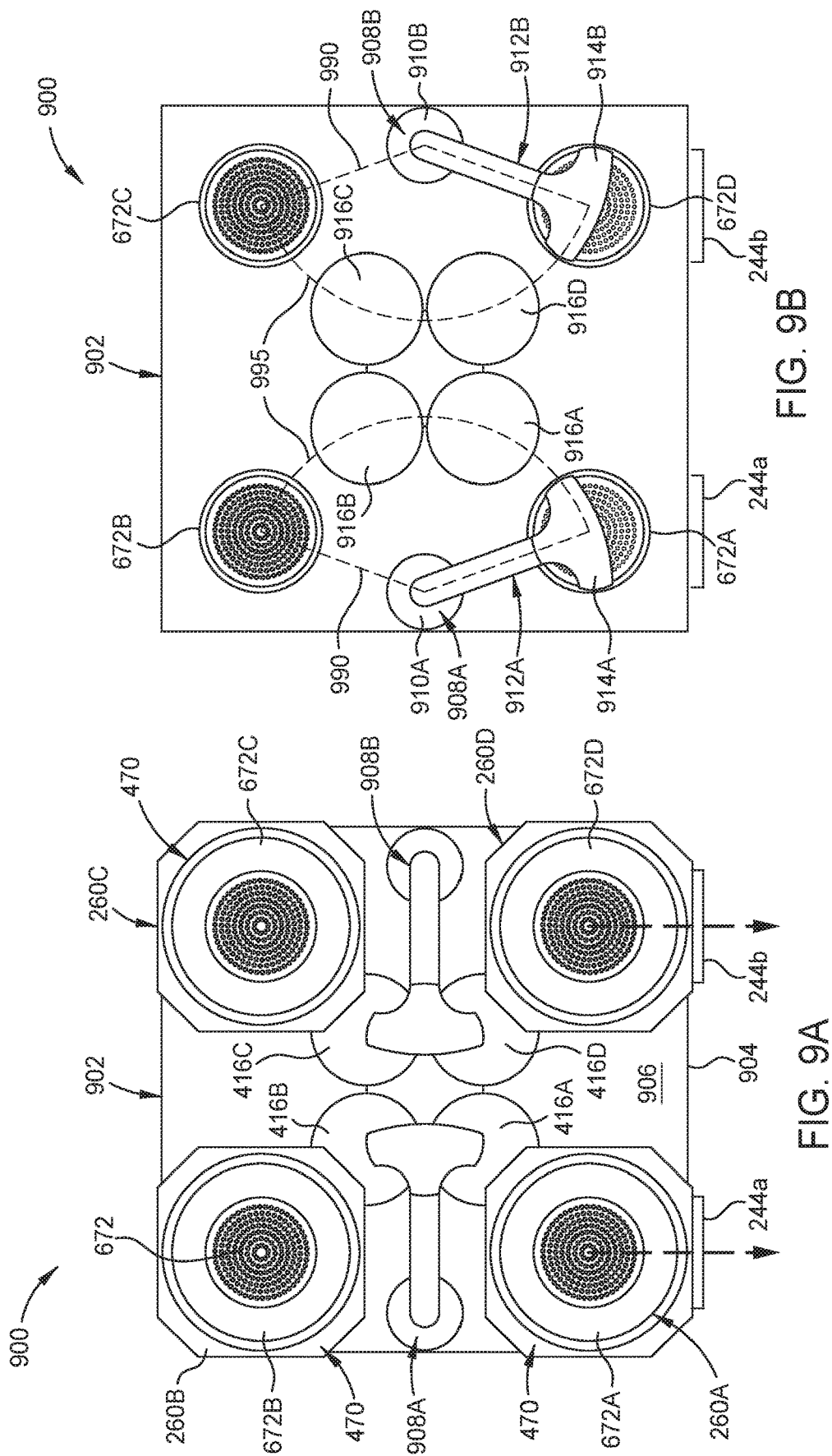

SUBSTRATE PROCESSING MODULE AND METHOD OF MOVING A WORKPIECE

BACKGROUND

Field

Embodiments of the present disclosure generally relate to an apparatus and a method and, more specifically, to a t substrate processing module and a method of moving a workpiece.

Description of the Related Art

Conventional cluster tools are configured to perform one or more processes during substrate processing. For example, a cluster tool can include a physical vapor deposition (PVD) chamber to perform a PVD process on a substrate, an atomic layer deposition (ALD) chamber for performing an ALD process on a substrate, a chemical vapor deposition (CVD) chamber for performing a CVD process on a substrate, and/or one or more other processing chambers.

The aforementioned cluster tools include transfer systems to move workpieces, such as substrates and shutter discs, to and from various processing chambers within the system. For example, carousel systems with multiple arms are used to grasp either substrates or shutter discs. Rotating the carousel system moves the workpieces in and out of the various processing chambers in the cluster tool. The carousel typically has different grasping arms with different form and function, depending on the desired workpiece to be grasped.

One drawback in the art is that carousels are typically designed to grasp either substrates or shutter discs, which leads to using multiple types of carousels or gripping arms. In addition, shutter garages that store workpieces are often located in non-high vacuum portions of the cluster tool, necessitating pumping down the vacuum when workpieces are transferred from the stacks to other portions of the tools.

Therefore, what is needed is a substrate processing module that can transfer both substrates and shutter discs using a single transfer system.

SUMMARY

Embodiments disclosed herein include a substrate processing module and a method of moving a workpiece. The substrate processing module and method allow for moving a shutter disc and a substrate using the same transfer system.

In one embodiment, a transfer chamber assembly is provided. The transfer chamber assembly includes a shutter stack and two processing regions. The shutter stack is disposed between the processing regions. The shutter stack is configured to store one or more workpieces. The one or more workpieces include substrates or shutter discs. The shutter stack includes a shutter base, one or more shutter disc supports, and a substrate support. The one or more shutter disc supports are coupled to the shutter base. The one or more shutter disc supports are configured to support a shutter disc. The substrate support is coupled to the shutter base. The substrate support is configured to support a substrate.

In another embodiment, a transfer chamber assembly is provided. The transfer chamber assembly includes a shutter stack, two processing regions, and a central transfer device. The shutter stack is disposed between the processing regions. The shutter stack is configured to store one or more workpieces. The one or more workpieces include substrates or shutter discs. The shutter stack includes a shutter base, one or more shutter disc supports, and a substrate support. The one or more shutter disc supports are coupled to the shutter base. The one or more shutter disc supports are configured to support a shutter disc. The substrate support is coupled to the shutter base. The substrate support is configured to support a substrate. The central transfer device includes one or more transfer arms. The transfer arms are configured to transfer at least one of the one or more workpieces from the shutter stack to one of the processing regions.

In yet another embodiment, a method of moving a workpiece is provided. The method includes moving an outer end from a first location to a shutter stack in a first direction, retrieving the workpiece from the shutter stack, and moving the outer end to a second location. The workpiece is a substrate or a shutter disc.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 3A is an isometric view of the processing module of FIG. 2A, according to one or more embodiments FIG. 3B is a plan view of the processing module of FIG. 2A, according to one or more embodiments.

FIG. 5A is a schematic plan view of a robot useful to move substrates between process stations in the processing module of FIG. 2A, according to one or more embodiments.

FIG. 5B is an isometric view of an implementation of the robot of FIG. 5A, according to one or more embodiments.

FIG. 5C is a plan view of an alternative robot configuration to that of FIGS. 5A and 5B, according to one or more embodiments.

FIG. 9A is a plan view of an alternate configuration of a processing module to that of FIG. 2A, according to one or more embodiments.

FIG. 9B is a plan view of a lower body portion of the processing module of FIG. 9A showing the motion path of paddle robots therein, according to one or more embodiments.

To facilitate understanding, identical reference numerals have been used, where possible, to designate identical elements that are common to the FIGs. It is contemplated that elements and features of one embodiment may be beneficially incorporated in other embodiments without further recitation.

DETAILED DESCRIPTION

Embodiments disclosed herein include a substrate processing module and a method of moving a workpiece. The substrate processing module includes a shutter stack and two processing regions. The shutter stack is disposed between the processing regions. The method of moving a workpiece includes moving a supporting portion from a first location to a shutter stack in a first direction, retrieving the workpiece from the shutter stack, and moving the supporting portion to a second location. The substrate processing module and method allows for moving workpieces to and from the shutter stack to the two processing regions. A central transfer robot of the substrate processing module is configured to grip both substrates and shutter discs, allowing for one robot when typically two robots would be required. The placement of the shutter stacks in a high vacuum environment reduces the need to pump up and down the vacuum when transferring substrates from the shutter stack to the processing regions. Embodiments of the disclosure can be useful for, but are not limited to, transferring substrates and shutter discs with the same apparatus.

Figure 2A:
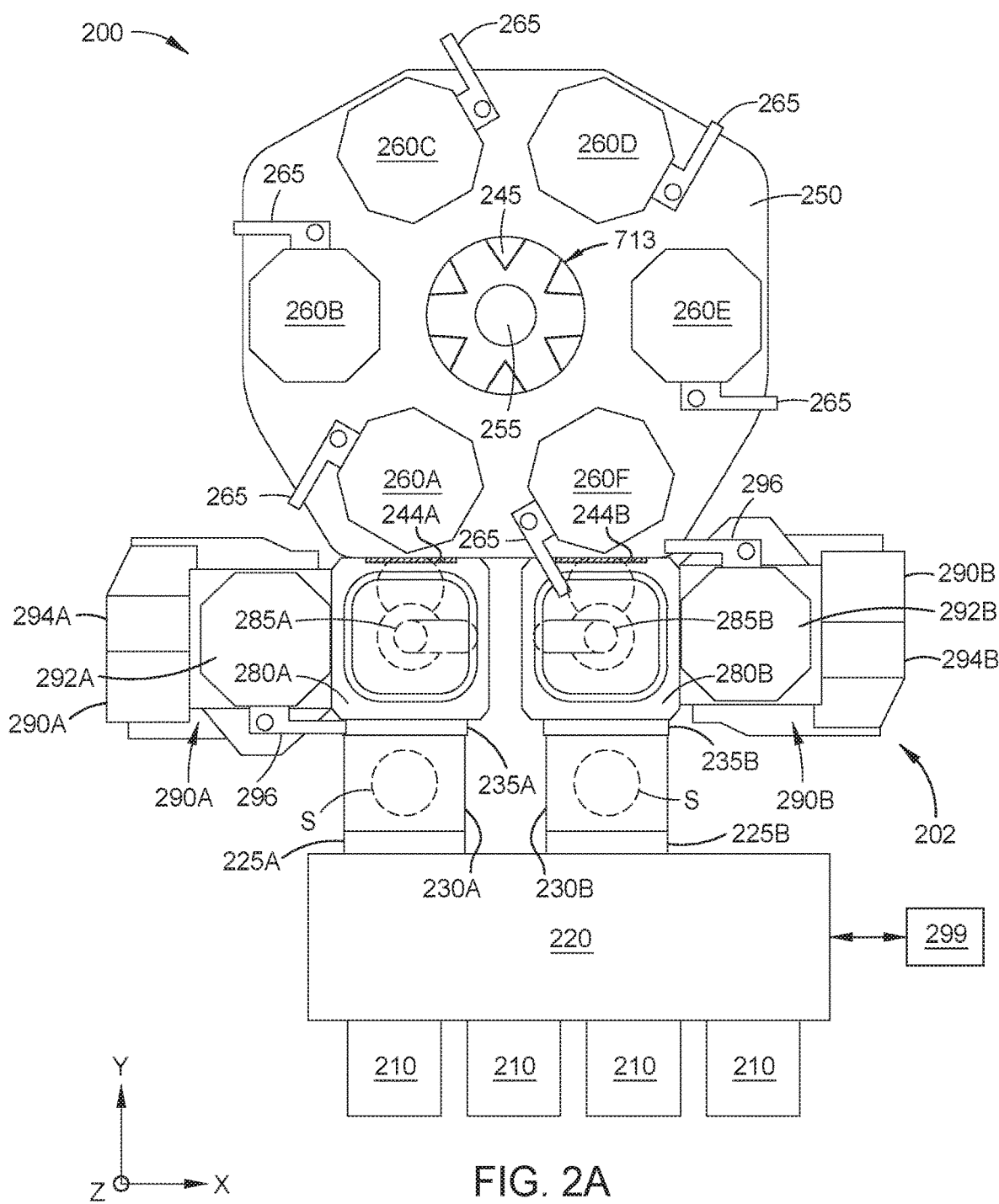
FIG. 2A is a plan view of a processing system that includes a processing module that includes process stations therein for processing substrates, according to one or more embodiments.

In one embodiment of the disclosure provided herein, a substrate processing system as shown in FIG. 2A includes an atmospheric or ambient pressure substrate input and output handling station also known as a front end 220, a substrate processing module 250 having multiple process stations 260 positioned thereon, and at least one intermediary section 202. A substrate is transferred into the intermediary section 202 from the front end 220 or from the processing module 250, or transferred from the intermediary section 202 to the front end 220 or to the processing module 250. While the disclosure provided herein generally illustrates a processing module that include six process stations this configuration is not intended to be limiting as to the scope of the invention provided herein, since a processing module 250 might alternatively include two or more process stations 260, such as four or more process stations 260 (e.g., FIGS. 9A-9B), eight or more process stations 260, ten or more process stations 260, or even 12 or more process stations 260. However, in process sequences used to form next generation devices, which include multilayer film stacks like On chip Inductor, optical film stacks, hard mask, patterning and memory applications, it is believed that, due to the number of layers that are to be formed and the similar processing times used to form each of the layers, a six or a twelve process station containing the processing module 250 configuration will improve substrate throughput, system footprint, and CoO over more conventional designs known in the art.

Figure 1B:
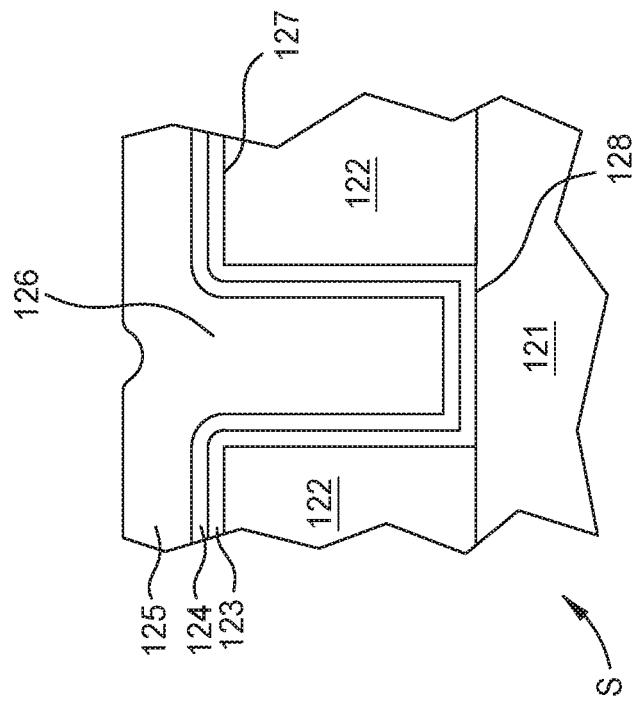
FIG. 1B is a partial sectional view of a substrate that has a feature formed thereon that is covered, lined and filled with layers of deposited material formed and/or processed by use of a method and/or apparatus disclosed herein.
Figure 1A:
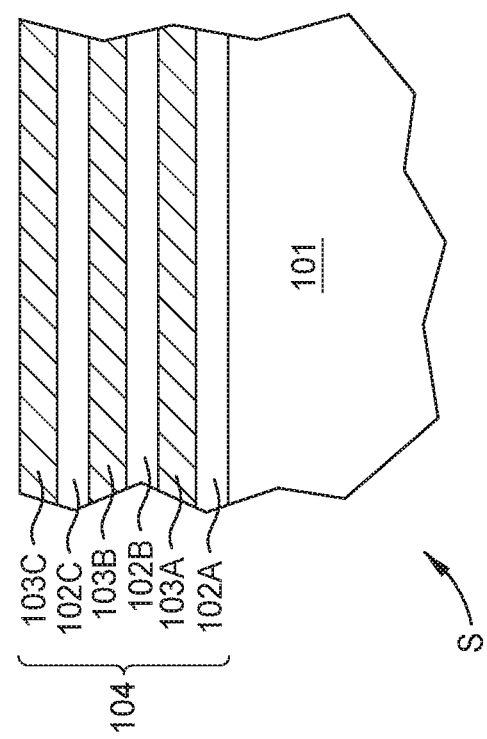
FIG. 1A is a partial sectional view of a substrate that has a plurality of film layers deposited thereon that are formed and/or processed by use of a method and/or apparatus disclosed herein.
Figure 2B:
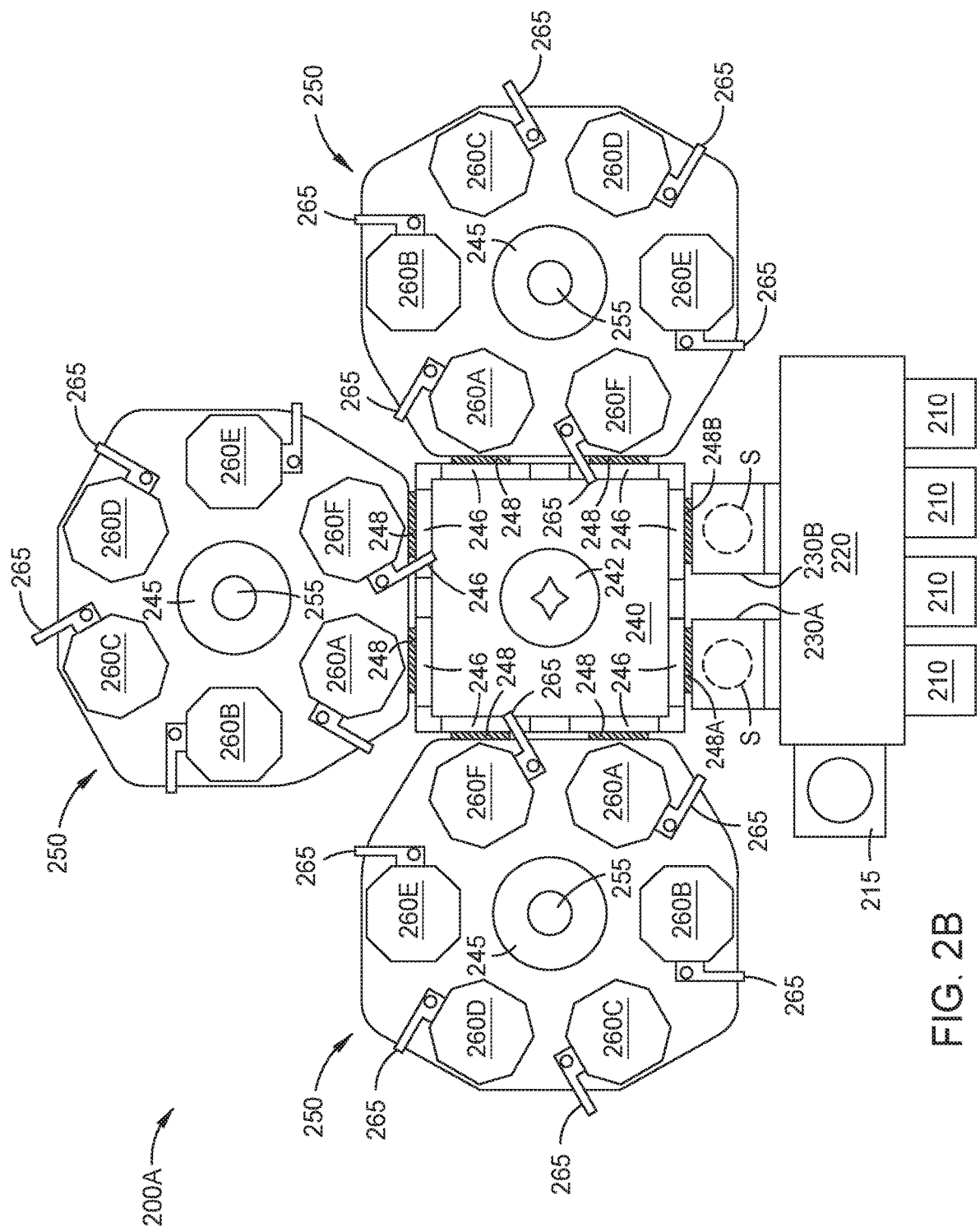
FIG. 2B is a plan view of an alternative version of a processing system that includes a plurality of processing modules that each include process stations therein for processing substrates, according to one or more embodiments.

A processing system, such as processing system 200 of FIGS. 2A and 2B, is used to form one or more thin films on the surface of a substrate S and/or, on a layer previously formed or processed on the substrate S. FIG. 1A shows a portion 101 of a substrate S having a plurality of thin film layers 102 and 103 formed thereon, and FIG. 1B shows a plurality of film layers extending over a previously formed layer 122 layer, formed on the conductive layer 121 of a substrate S.

In FIG. 1A, a plurality of film layers 104 are shown sequentially layered on the portion 101 of the substrate S, or on a layer previously formed thereon. For example, using the processing system of FIG. 2A, wherein six process stations 260A-260F are accessible within the substrate processing module 250, a substrate may be sequentially moved along the circumference of an imaginary circle 252 (FIG. 3B) which intersects a central location of each of the process stations 260, such that a plurality of a first thin film layer 102 and a plurality of a second thin film layers 103 can be sequentially deposited thereon. Each process station 260A-260F can be independently or similarly configured to enable a deposition process, for example a PVD, CVD, ALD (atomic layer deposition) or other type of deposition process, or an etching process. For example, metal layers 102A-102C may deposited on a substrate and be composed of a metal, and reactive metal layers 103A-103C may be deposited on a substrate and be composed of a reactive metal (e.g., metal nitride), wherein the metal in the reactive metal layers 103A-103C is the same metal as the metal in the metal layers 102A-102C. In this example, during a substrate processing sequence performed in the processing module 250, the process stations 260B, 260D and 260F are used to form reactive metal layers 103A-103C (e.g., TaN, TiN, AlN, or SiN layers) on the exposed surface of the substrate by use of a reactive PVD deposition process, and the process stations 260A, 260C and 260E are used to form pure metal layers 102A-102C (e.g., Ta, Ti, Al, Co, Si layers) by use of non-reactive PVD deposition process, such that the process sequence allows a metal layer followed by a reactive metal layer to be formed. By sequentially moving and sequentially processing the substrate in all of process stations 260A-260F, a pure metal/reactive metal/pure metal/reactive metal/pure metal/reactive metal multi-layer film stack can be formed. Alternatively, the base materials of the thin film layers 102 and 103 may be different materials, in which case a sputtering target of a first material type is sputtered in process stations 260A, 260C and 260E, and a target of a second type is sputtered in process stations 260B, 260D and 260F to form alternating layers of a first material type and a second material type. Here, for example, alternating layers of a metal layers 102A-102C and a dielectric layer 103A-103C or of a metal layer 102A-102C and a semiconductor layer 103A-103C can be formed, for example alternating layers of molybdenum and silicon. Likewise a multi-layer film of the same material may be formed wherein all of layers 102A-102C and 103A-103C are the same material, and the substrate is sequentially moved to each process station to have the same material deposited thereon in each process station 260. The choice of the sputter target material, processing parameters (e.g., processing pressure) and the inert or reactive nature of the gas used to form the plasma in a process station 260, are user selectable such to allow the user or operator of the processing system 200 the flexibility to control the materials and material properties of any film within a film stack formed thereon. It has been found that substrate processing sequences that are used to form a repeating stacked layer configuration, as shown in FIG. 1A, wherein the stacked layer deposition processes (e.g., processes for forming thin film layers 102 and 103) have similar chamber processing times, a significant throughput increase and improved CoO has been observed when using the one or more system configurations and methods disclosed herein. In one example, it has been found that substrate processing sequences that include stacked layer deposition processes that have processing times less than 90 seconds, such as between 5 seconds and 90 seconds, in combination with the addition of the lower substrate transferring overhead times achieved using the architecture described herein, which is discussed further below, has a significant advantage over current conventional processing system designs.

A substrate loaded into the processing module 250 need not be processed at each process station 260A-260F. For example, each of the process stations 260A-260F can employ the same sputter target material, a number of substrates equal to the number of process stations 260 are loaded into the processing module 250, and each substrate is processed in a different one of the process stations 260 for deposition of a same material film layer thereon. Thereafter all of these substrates are removed from the processing module 250, and an equal number of substrates are loaded again into the processing module 250, and the processing of each of these substrates by a different single one of the process stations is performed. Alternatively, different processes are performed in each adjacent process station arrayed along the circumference of the imaginary circle. For example a first deposition process to deposit a first type of film layer is performed in process stations 260A, 260C and 260E, and a second deposition process to deposit a second type of film layer is performed in process stations 260A, 260C and 260E. However, in this case, an individual substrate is exposed to only two process stations 260, for example a first substrate is exposed to only process stations 260A and 260B, a second substrate is exposed to only process stations 260C and 260D, and a third substrate is exposed to only process stations 260E and 260F. Then the substrates are removed. Likewise, each substrate process in the system can be processed in up to all process stations 260, and the process performed at each process station 260 can be the same or different from one or all of the remaining process stations 260.

Referring to FIG. 1B, a feature 126 extending inwardly of a dielectric layer 122 is shown. Here, the feature, such as a trench, a contact, or a via, has been formed into and through the dielectric layer 122 such as by pattern etching the dielectric layer 122 through a patterned mask (not shown). In FIG. 1B the feature 126 is a conductive via disposed in a via opening 128, wherein the via opening 128 extends down to an underlying conductive layer 121 previously formed on a substrate (not shown), for example a copper layer used in an integrated circuit device. To form the feature 126 in the via opening 128, a barrier layer 123 is first formed over the upper surface or field 127 of the dielectric layer 122, over the sidewall(s) of the via opening 128, and over the portion of the conductive layer 121 exposed at the base of the via opening 128. The barrier layer 123 may include a single material layer, or two or more different materials in a stack. For example, a bi-layer of a tantalum film layer followed by a tantalum nitride film layer, may be employed, and each sub layer of the bi-layer may be formed in one or more of the process stations 260A-260F of FIG. 2A. Then, a seed layer 124, for example a thin layer of copper, is formed over the previously deposited barrier layer 123. The seed layer 124 is used to promote plating of a copper layer 125 thereover in a copper plating tool separate from the processing system 200. Here, using the processing system 200, a tantalum bilayer can be sputtered from a tantalum target onto the same substrate at process stations 260A, 260B, then a tantalum nitride layer can be deposited on the tantalum layer by reactive sputtering of a tantalum target in an inert gas-nitrogen gas plasma to form a tantalum nitride layer thereon in process stations 260C, 260D, and a copper seed layer is formed over the tantalum nitride layer by sputtering a copper target in an inert gas plasma at process stations 260E, 260F. Alternatively, the tantalum layer could be deposited in on a substrate in process station 260A or 260D, the tantalum nitride layer on a substrate in process station 260B or 260E, and the copper seed layer deposited on the substrate in process station 260C or 260F. In this configuration, a first substrate is sequentially processed in process stations 260A-260C, and a second substrate is sequentially processed in process stations 260D-260F. As will be discussed further below, it is believed that substrate processing sequences that are used to deposit materials in a set grouping of processing sequences, as shown in FIG. 1B, will achieve a significant throughput increase when using one or more of the system designs and methods disclosed herein.

Figure 4A:
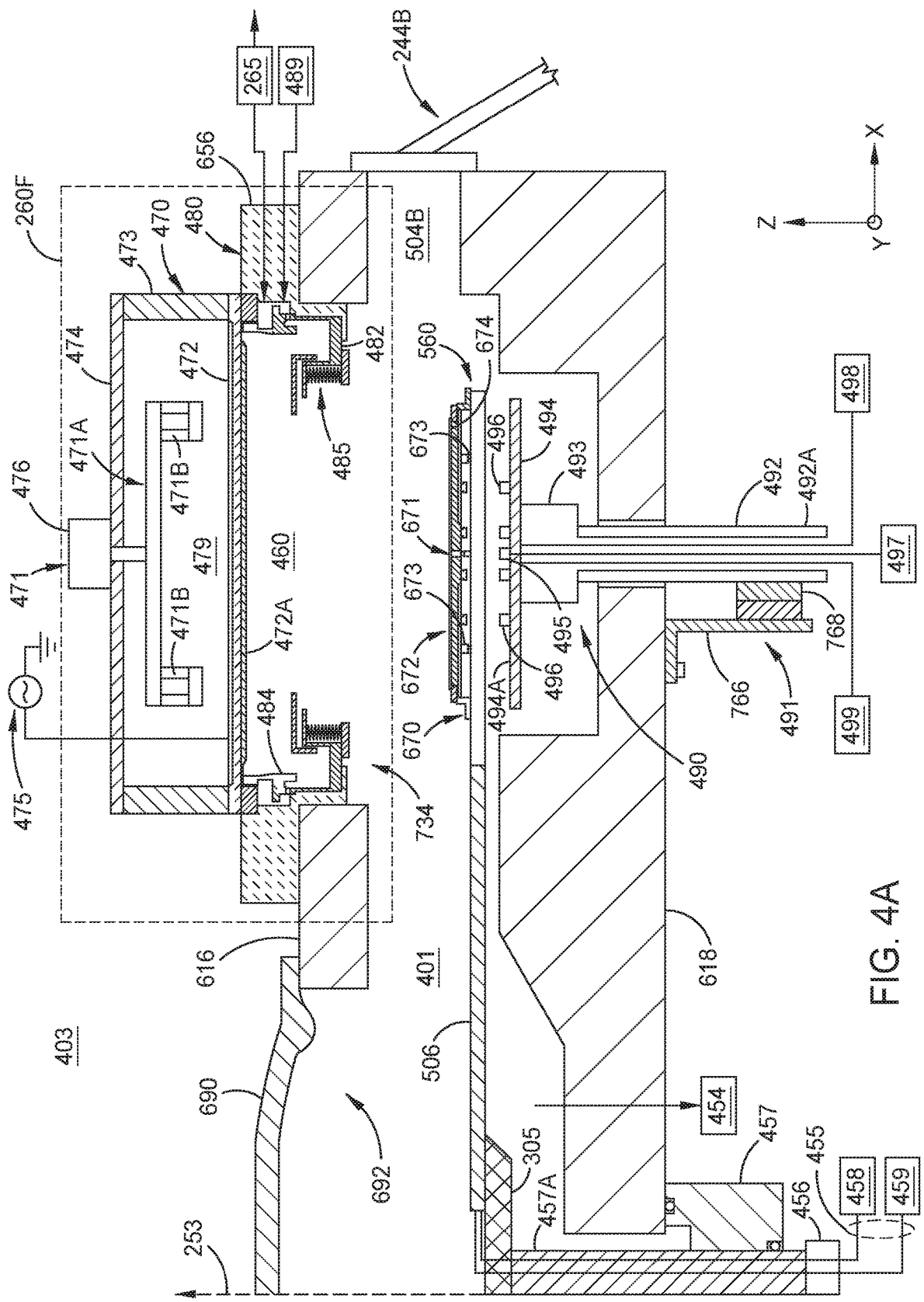
FIG. 4A is a partial sectional view of a portion of the processing module of FIG. 2A, showing a substrate support in a transfer position below a process station of the processing module, according to one or more embodiments.
Figure 4B:
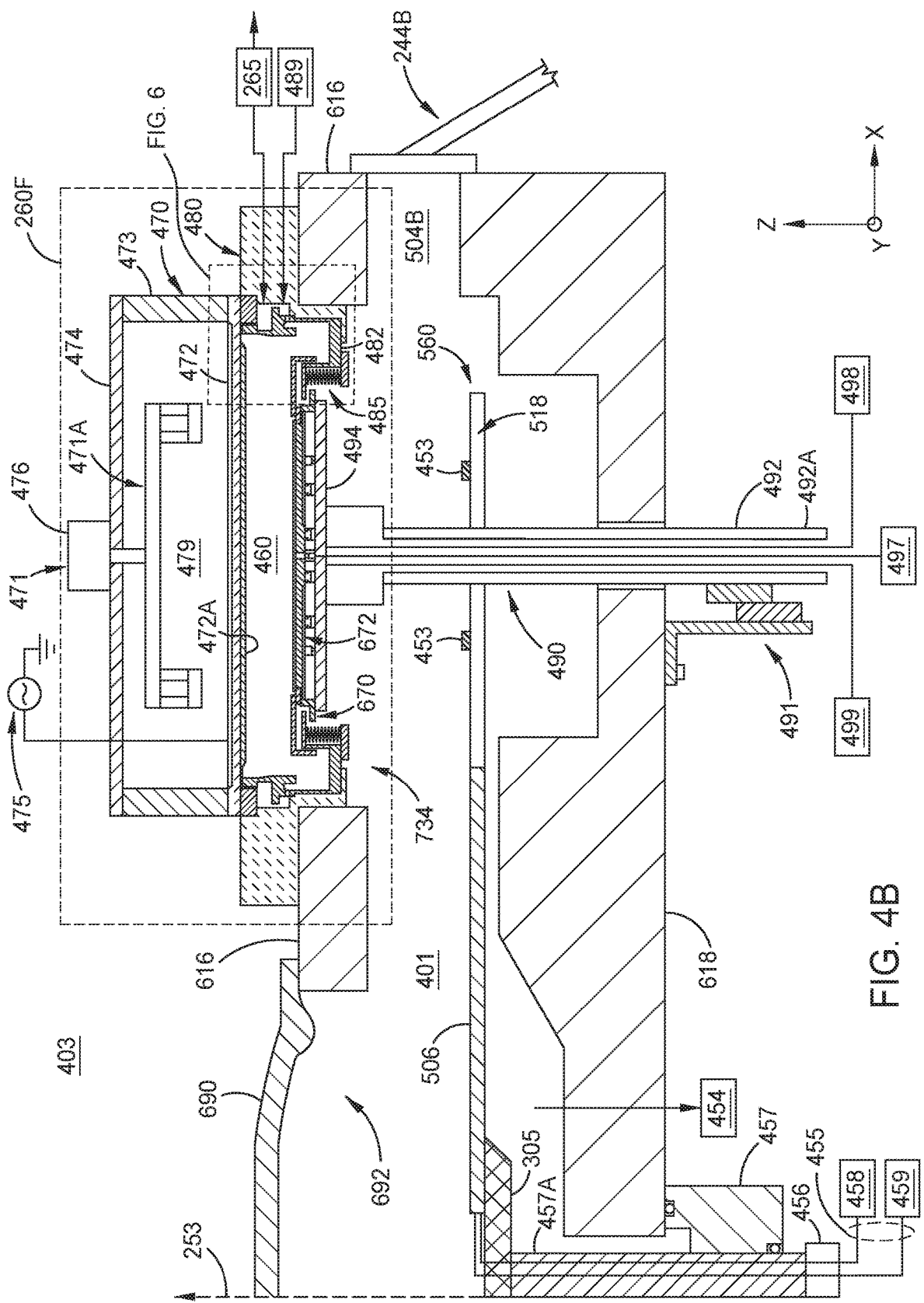
FIG. 4B is a partial cross-sectional view of the processing module of FIG. 2A, showing a substrate support lifted into a process position to form a sealed substrate process volume therewith, according to one or more embodiments.

Referring again to FIG. 2A, processing system 200 generally includes the processing module 250, the intermediary section 202, which is coupled between the processing module 250 and the front end 220, and a system controller 299. As shown in FIG. 2A, the intermediary section 202 includes a pair of loadlock chambers 230A, 230B and a pair of intermediate robot chambers 280A, 280B. Each of the loadlock chambers 230A, 230B is separately connected through a respective first valve 225A, 225B, at one side thereof to the front end 220, and through a respective second valve 235A, 235B, to one of the intermediate robot chambers 280A, 280B, respectively. During operation a front end robot (not shown) in the front end 220 moves a substrate therefrom into a loadlock chamber 230A or 230B, or removes a substrate from a loadlock chamber 230A, 230B. Then an intermediate robot 285A, 285B in one of the associated intermediate robot chambers 280A, 280B connected to an associated one of the loadlock chambers 230A, 230B moves a substrate from the loadlock chamber 230A or loadlock chamber 230B and into the corresponding intermediate robot chamber 280A, 280B. In one embodiment, the intermediary section 202 also includes a preclean/degas chamber 292 connected to an intermediate robot chamber 280, for example a preclean/degas chamber 292A connected to intermediate robot chamber 280A and a preclean/degas chamber 292B connected to intermediate robot chamber 280B. A substrate loaded into one of the loadlock chambers 230A, 230B from the front end 220 is moved, by the associated intermediate robot 285A or 285B, from the loadlock chamber 230A or 230B and into the preclean/degas chamber 292A or 292B. In the preclean/degas chambers 292A, 292B, the substrate is heated to volatilize any adsorbed moisture or other volatilizable materials therefrom, and is subjected to a plasma etch process whereby residual contaminant materials thereon are removed. Thereafter, the substrate is moved by the appropriate associated intermediate robot 285A or 285B back into the corresponding intermediate robot chamber 280A or 280B and thence onto a substrate support 672 (FIG. 4A, B) at a process station 260 in the substrate processing module 250, here process station 260A or 260F. In some embodiments, as illustrated in FIGS. 4A and 4B, once the substrate S is placed on the substrate support 672, it remains thereon until all processing thereof in the processing module 250 is completed.

Here, each of the loadlock chamber 230A and the loadlock chamber 230B is connected to a vacuum pump (not shown), for example a roughing pump, the output of which is connected to an exhaust duct (not shown), to reduce the pressure within the loadlock chamber 230A, 230B to a sub-atmospheric pressure on the order of about $10^{-3}$ torr. Each loadlock chamber 230A or 230B may be connected to a vacuum pump dedicated thereto, or a vacuum pump shared with one or more components within the processing system 200, or to a house exhaust other than a vacuum pump to reduce the pressure therein. In each case, a valve (not shown) can be provided on the loadlock chamber 230A, 230B exhaust to the pump or house exhaust to isolate, or substantially isolate, the pumping outlet of the loadlock chamber 230A, 230B connected to the vacuum pump or house exhaust from the interior volume of the loadlock chamber 230A, 230B when the first valve 225A or 225B respectively is open and the interior of the loadlock chamber 230A, 230B is exposed to atmospheric or ambient pressure conditions.

After the substrate has been processed, for example, in the, preclean/degas chamber 292B, the intermediate robot 285B removes the substrate from the preclean/degas chamber 292B. A process chamber valve 244B, which is disposed between the intermediate robot chamber 280B and the processing module 250, is opened to expose an opening 504B (FIGS. 3A and 4A) formed in a wall of the processing module 250, and the intermediate robot 285B moves the substrate through the opening 504B to a process station 260F of the processing module 250 where it is received for processing within one or more of the process stations of the processing module 250. In the same manner, a substrate can be moved from the front end 220 through the loadlock chamber 230A, to the preclean/degas chamber 292A, and then to the processing module 250 through a process chamber valve 244A (FIG. 2A) and an opening 504A in the processing module 250 wall to be received at process station 260A. Alternatively, the process chamber valves 244A, 244B may be eliminated, and intermediate robot chambers 280A, 280B be in direct uninterrupted fluid communication with the interior of the processing module 250

Each of the loadlock chambers 230A, 230B and intermediate robot chambers 280A, 280B are configured to pass substrates from the front end 220 into the processing module 250, as well as from the processing module 250 and into the front end 220. Thus, with respect to the first intermediate robot chamber 280A, to remove a substrate positioned at process station 260A of the processing module 250, the process chamber valve 244A is opened, and the intermediate robot 285A removes the substrate from the process station 260A and moves it, through an open second valve 235A connected between the intermediate robot chamber 280A and the loadlock chamber 230A, to place the substrate in the loadlock chamber 230A. The end effector of the intermediate robot 285A on which the substrate was moved is retracted from the loadlock chamber 230A, the second valve 235A thereof is closed, and the interior volume of the loadlock chamber 230A is optionally isolated from the vacuum pump connected thereto. Then the first valve 225A connected to the loadlock chamber 230A is opened, and the front end 220 robot picks up the substrate in the loadlock chamber 230A and moves it to a storage location, such as a cassette or front-opening unified pod (FOUP) 210, located within or connected to a sidewall of, the front end 220. In a similar fashion, using the intermediate robot chamber 280B, the intermediate robot 285B, the loadlock chamber 230B and associated valves 235B and 225B thereof, a substrate can be moved from the process station 260F location to the front end 220. During the movement of a substrate from the processing module 250 to the front end 220, a different substrate may be located within the preclean/degas chamber 292A, 292B connected to the intermediate robot chamber 280A, 280B through which the substrate being moved to the front end 220 passes. Because each preclean/degas chamber 292A, 292B is isolated from the intermediate robot chamber 280A, 280B to which it is attached by a valve, passage of a different substrate can be undertaken from the processing module 250 to the front end 220 without interfering with the processing of a substrate in the respective preclean/degas chambers 292A, 292B.

The system controller 299 controls activities and operating parameters of the automated components found in the processing system 200. In general, the bulk of the movement of a substrate through the processing system is performed using the various automated devices disclosed herein by use of commands sent by the system controller 299. The system controller 299 is a general use computer that is used to control one or more components found in the processing system 200. The system controller 299 is generally designed to facilitate the control and automation of one or more of the processing sequences disclosed herein and typically includes a central processing unit (CPU) (not shown), memory (not shown), and support circuits (or I/O) (not shown). Software instructions and data can be coded and stored within the memory (e.g., non-transitory computer readable medium) for instructing the CPU. A program (or computer instructions) readable by the processing unit within the system controller determines which tasks are performable in the processing system. For example, the non-transitory computer readable medium includes a program which when executed by the processing unit are configured to perform one or more of the methods described herein. Preferably, the program includes code to perform tasks relating to monitoring, execution and control of the movement, support, and/or positioning of a substrate along with the various process recipe tasks and various processing module process recipe steps being performed.

Referring to FIG. 2B, an alternate construct of a processing system 200A is shown, wherein a transfer chamber 240 is interposed between the loadlock chambers 230A, 230B and one or more processing modules 250. While not intended to be limiting as to the scope of the disclosure herein, the processing system 200A shown in FIG. 2B does not include separate intermediate robot chambers 280A, 280B or preclean/degas chambers 292A, 292B. Here, by the use of an intermediate transfer chamber 240, having a transfer chamber robot 242 located therein, multiple processing modules 250 are connectable to a single front end 220. Here, transfer chamber 240 is generally rectangular in plan view, and includes four generally planar upright walls 246, attached to three of which are processing modules 250 and to a fourth of which is connected the loadlock chambers 230A, 230B through the second valves 235A, 235B, and process chamber valves 244A, 244B, respectively. Here, after the front end robot places a substrate into one of the loadlock chambers 230A, 230B while the second valve 235A, 235B respectively thereof is closed, the first valve 225A, 225B thereof, respectively, is then closed, the second valve 235A, 235B thereof is opened, and the transfer chamber robot 242 (shown schematically in FIG. 2B) takes the substrate from the loadlock chamber 230A or 230B and places it into one of the first process stations 260A of a processing module 250 through a processing system valve 248 which is selectively openable to move substrates into and out of the processing module at station 260A, and closeable to isolate the interior volume of the transfer chamber 240 from the interior volume (e.g., transfer region 401) of the processing module 250.

As there is no intermediate robot chamber 280A, 280B and/or preclean/degas chamber 292A, 292B within the processing system 200A, as in the processing system 200 of FIG. 2A, precleaning of substrates occurs within the one or more of the processing modules 250, such as at a process station 260A to allow the precleaning process to be performed before a film layer is deposited thereon.

Referring to FIGS. 2A, 3A-3B, 4A-4B, 5 and 8, in which further details of the components within and the interior regions of a processing module 250 are shown. As shown in FIGS. 4A and 4B, a removable central cover 690 extends over a central opening 713 (FIGS. 2A, 3B, and 8) in an upper wall 616 of the processing module 250. The central cover 690 is removable to allow access to the interior, transfer region 401, of the processing module 250 to service a central transfer robot 245 thereof. At least one, and in the case of the processing module 250 of FIGS. 3A and 4A-4B, two substrate transfer openings 504A, 504B extend inwardly of the outer surface of a circumferential wall 619 and into the transfer region 401 of the processing module 250. The transfer openings 504A, 504B allow the intermediate robot 285A, 285B, or the central transfer robot 245, to transfer a substrate positioned external to the processing module 250 to a position on a substrate support 672 that is positioned on a support arm 308 of the central transfer robot 245. Alternately, transfer openings 504A, 504B allow the intermediate robot 285A, 285B, or the central transfer robot 245, to remove a substrate from a substrate support 672 that is positioned on the support arm 308 of the central transfer robot 245.

In FIGS. 4A and 4B, process station 260F of FIGS. 2A and 3A-3B is shown, wherein opening 504B opens into the processing module 250 at process station 260F. In this example, the location of the opening 504A corresponds to a location that is adjacent to the process station 260A. The processing module 250 is configured to include the central transfer robot 245 (FIGS. 3A, 3B), from which a plurality of support arms 308 radially extend. In some embodiments, as shown in FIG. 5A, the number of support arms 308 is equal to the number of process stations 260 of the processing module 250. However, the number of support arms 308 of central transfer robot 245 can be less than or greater than the number of process stations 260 of the processing module 250. In one embodiment, the number of support arms 308 is greater than the number of process stations 260 to allow more substrates to be transferred through the transferring region at one time and/or allow some of the support arms 308 to support additional hardware components, such as a pasting disc and/or shutter disc (not shown) that is used to perform a PVD pasting operation to remove contamination from a surface of a PVD target. A PVD pasting operation is typically performed in a process station 260 between two substrate PVD deposition processes performed in the same substrate process station 260.

The process stations 260 are arrayed, and are equally and circumferentially spaced from one another, along an imaginary circle 252 (FIG. 3B) centered on central axis 253 (i.e., parallel to the Z-direction), such that the center the imaginary circle 252 is coincident with the central axis 253. For example, where the process station 260F is a PVD type of process station 260, the center of the PVD target overlies a portion of the imaginary circle 252, and the centers of the targets of the remaining process stations 260A-260E are equally circumferentially spaced from one another along the imaginary circle 252. The circumferential spacing measured along the imaginary circle 252 between the centers of two adjacent the process stations 260 can be between about 700 mm and about 1000 mm, such as between 800 mm and 900 mm. In some embodiments, the circumferential spacing measured along the imaginary circle 252 between the centers of two adjacent the process stations 260 can be equal to or greater than about 0.5 of the diameter of a substrate that is being processed within the processing system and less than about 3 diameters of a substrate that is being processed within the processing system, such between about 1 and about 2 substrate diameters (e.g., 150 mm, 200 mm, 300 mm or 450 mm diameter substrates).

Referring to FIGS. 3A-3B, 4A-4B and 5A-5B, the central transfer robot 245 is a carousel type robot assembly 501 that includes a central support 305, to which the proximal end 561 of the support arms 308 are affixed, such as by threaded fasteners (not shown). The central support 305 is rotated by a carousel motor 457 (FIGS. 4A-4B and 8) positioned below the processing module 250, and may include a stepper motor or a servo motor that is coupled to the lower wall 618 (FIG. 4A). The carousel motor 457 can include a drive shaft 457A that is coupled to the central support 305 and is coincident with the central axis 253 so as to cause the central support 305 and each of the support arms 308 to rotate through an arc centered about the central axis 253 as the drive shaft of the carousel motor 457 rotates. The uppermost surface of a revolved volume through which the support arms 308 and substrate supports 672 pass as they are rotated by the carousel motor 457 is generally referred to herein as the transfer plane, which is parallel to the X-Y plane in FIG. 4A. The central support 305 and each of the support arms 308 are positioned within the transfer region 401 that is separately evacuated by a vacuum pump 454, which can be a turbopump, cryopump, roughing pump or other useful device that is able to maintain a desired pressure within the transfer region 401 of the processing module 250. The central support 305 is generally positioned over a central opening 723 (FIG. 8) formed in the lower wall 618 of a lower monolith 720. As will be discussed further below, the transfer region 401 and processing region 460 of a process station 260 are separately isolatable so that processes being performed in a process station 260 can be controlled and performed at a different vacuum pressure than the transfer region 401 and use various different processing gases without the concern of contaminating the transfer region 401 or other adjacently positioned process stations 260.

In some embodiments, support arms 308 are configured to support a substrate support 672 that is configured to support a substrate that is to be processed in a processing region of a process station 260. Substrates that are positioned on the substrate supports 672, which are positioned on the support arms 308, are positioned so that the center of the substrate is positioned over a portion of the imaginary circle 252, within tolerance limits of the placement of the substrate thereon. Likewise, the region of each of the support arms 308 on which a substrate support is placed, or supporting portion 560 (FIG. 4A), is also aligned with the imaginary circle 252 (FIGS. 3B and 5A) to allow the center of the supporting portion 560 to traverse the imaginary circle 252 as the supporting portion 560 orbits around the central axis 253 when the central support 305 is rotated about the central axis 253.

In addition to the process stations 260, vacuum pumps 265, and the central transfer robot 245, FIG. 3B additionally discloses one or more shutter stacks 310 disposed within the substrate processing module 250. The shutter stacks 310 can be disposed between any of the process stations 260 and an adjacent process station 260. In some embodiments, there are multiple shutter stacks 310 disposed within the substrate processing module 250, such that the number of shutter stacks 310 equals the number of process stations 260 within the substrate processing module 250. In some embodiments, there are six shutter stacks 310, such that one shutter stack 310 is disposed between each of the six process stations 260. The shutter stacks 310 can be disposed radially outward from the central transfer robot 245. In some embodiments, a plurality of supporting portions 560 of the central transfer robot 245 are also configured to transfer substrates to and from the shutter stacks 310. The plurality of supporting portions 560 can extend radially outward from the central transfer robot 245 to at least partially above or below the shutter stacks 310.

The shutter stacks 310 can provide shutter discs to the substrate processing module 250. The shutter discs can be utilized for preconditioning the process stations 260 either during an initial burn of the chambers that make up the process stations 260, or the shutter discs can be use in situ for target or process kit cleaning. The shutter disks can also be able to be used for a paste process within the process stations 260. The paste process is an in situ conditioning process step that uses existing materials (targets or gas) or adds new materials (e.g., gas) to create a blank cover film over all of the process environment surfaces in the process station 260, in order to reduce defects or other lifetime driven performance effects. The shutter disks are used to protect surfaces that otherwise would normally not be exposed to the process.

The shutter stacks 310 can also be used to store substrates between processing operations within the process stations 260. In this embodiment, a substrate is moved from one of the process stations 260 to a shutter stack 310 before being moved to a second process station 260, or being transferred out of the substrate processing module 250. This embodiment is beneficial in preventing backup within the substrate processing module 250 when one or more processing operations takes a greater amount of time to complete than other processes, or if it is beneficial to rest a substrate before a subsequent processing operation. In some embodiments, one or more of the shutter stacks 310 are used for providing shutter disks, while the remaining shutter stacks are used for storing substrates between processing operations. In some embodiments, the shutter stacks 310 are cooling or anneal chambers, such that substrates are cooled or annealed between process stations 260. In some embodiments, the number of supporting portions 560 are increased by the number of shutter stacks 310 present in the substrate processing module 250.

Disposing the shutter stacks 330 outside of the process stations 260 allows for transport of the shutter discs and/or substrates contained therein without breaking vacuum of the substrate processing module 250. Reducing the need to break vacuum decreases processing time of the substrate processing module 250, reducing costs to the user. Further details of the shutter stacks 310 are given in the discussion of FIGS. 12A-12D below.

Referring to FIG. 5B, one configuration of the central transfer robot useful for transferring substrate supports 672 between the process stations 260A-260F of FIGS. 2A and 2B is shown. Here, central support 305 includes a centrally located through opening 500, centered around the central axis 253 and into which the drive shaft 457A of the carousel motor 457 (FIG. 4A) positioned below the processing module 250, is connected to cause rotation of the central support 305 about central axis 253. Each support arm 308 includes an extension arm portion 506 that is positioned between the supporting portion 560 and the proximal end 561. The extension arm portion 506 has at least one, and here two, weight reduction and thermal heat conduction reducing cutout regions 510 that extend generally parallel to either side of a radius extending from the central axis 253. In some configurations, the extension arm portion 506 terminates at a c-shaped end region 508, as seen in a plan view, and forms part of the supporting portion 560. In some configurations, the c-shaped end region 508 includes opposing ends 514, 516 that are spaced apart a distance that is smaller than a diameter 520 of a through opening 518 that the c-shaped end region 508 partially surrounds. A perimeter flange 670 (FIG. 4A) of the substrate support 672, which is generally circular in layout has an inner and an outer diameter, and is configured to rest on the top on the supporting portion 560 during movement of the substrate support 672 between process stations 260, and at the process station 260 prior to the substrate support 672 being lifted therefrom.

Referring to FIGS. 4A-4B, in some embodiments, the support arms 308 include a plurality of electrical contacts 453 (FIG. 4B) that are disposed on an upper surface of the support arm 308 and within the supporting portion 560. The electrical contacts 453 are used to provide electrical power to one or more electrical elements formed within a body 643 (FIG. 6) of the substrate support 672 while the substrate support 672 is supported on the support arm 308. Thus, the combination of the body 623 and the electrical contacts 673 can considered an electrostatic chuck (ESC). The one or more electrical elements formed within the substrate support 672 can include resistive heating elements 642 (FIG. 6) that are coupled to two or more electrical contacts 673 (FIG. 4A) formed on a lower surface of the substrate support 672, and/or one or more chucking electrodes 641 (FIG. 6) that are separately coupled to two or more additional electrical contacts 673 formed on a lower surface of the substrate support 672. As schematically illustrated in FIGS. 4A-4B, the electrical contacts 453 are electrically coupled to one or more power sources, such as a DC chucking power supply 458 and/or a heater power supply 459 by use of a slip ring 456 that is adapted to allow electrical connections to be made to the electrical contacts 453 while the support arms 308 are rotated by the carousel motor 457. Multiple conductors or wires 455 are used to connect the one or more power sources to the electrical contacts 453. The conductors or wires 455 are routed through the drive shaft 457A, central support 305, and support arms 308, which is positioned within the transfer region 401 of the processing module 250. For example, three wires that are coupled to the power supply 458 and two wires that are coupled to the power supply 459 are provided through each support arm 308 so that they can each be separately connected to an electrical contact 453. Therefore, when the substrate support 672 is positioned on the supporting portion 560, the electrical contacts 673 of the substrate support 672 are electrically coupled to the electrical contacts 453 of the support arms 308 so that a substrate can remain chucked to the substrate support 672 and a desired temperature can be maintained while the substrate S and substrate support 672 are being transferred within the transfer region 401. The ability to allow the substrate S to be chucked and heated during a transferring process allows greater rotational speeds to be achieved by the carousel motor 457 during a transfer process without the concern of losing the substrate, and allows the temperature of the substrate to be consistently maintained between processes performed in each process station 260.

FIG. 5C is a plan view of the central transfer robot 245 that includes an alternative robot construct that is a dual arm robot 540 that includes two end effectors 530, 532. A central transfer robot 245 that includes a dual arm robot 540 can be useful in cases where a substrate processing sequence performed in a processing module 250 does not include or require the substrate to be sequential transferred along a path that extends along the imaginary circle 252 in either direction. In this processing module 250 configuration, the substrate supports 672 need not be moveable in a lateral plane (i.e., X-Y plane) such that each substrate support 672 is maintained in one position in the X-Y plane beneath a process station 260, and during processing the substrates are transferred between the laterally fixed substrate supports 672 by the dual arm robot 540.

In some embodiments, the two end effectors 530, 532 of the dual arm robot 540 are independently operable and extend from, and swing arcuately about a central axis 505 which extends in the Z-direction (e.g., perpendicular to the plane of FIG. 5C) and is typically coincident with the central axis 253 of the processing module 250. Each end effector 530, 532 is operatively coupled to a central hub 536, composed of an upper rotatable hub and a lower rotatable hub (not shown) that are each independently rotatable about central axis 505. End effector 530 includes a first fork 537a and a first arm 538. A first hub arm 542 is coupled to the central hub 536 at a first end thereof and to the first arm 538 at the end thereof distal to the end effector 536a at a first wrist connection 544, whereby the first arm is pivotable about a first wrist axis Oi to allow the first end effector 530 to rotate about the first wrist axis Oi. Likewise, the first wrist connection 544, and thus the first wrist axis Oi, can orbit about the central axis 505, by virtue of the arcuate movement of the first hub arm about the central axis 505. End effector 532 includes a second fork 537b and a second arm 546. A second hub arm 548 is coupled to the upper rotatable hub at a first end thereof and to the second arm 546 at the end thereof distal to the second end effector 532 at a second wrist connection 550, whereby second arm 546 is pivotable about a second wrist axis $\Omega_2$ to allow the second end effector 532 to rotate about the second wrist axis $\Omega_2$. Likewise, the second wrist connection 550, and thus the second wrist axis $\Omega_2$, can orbit about the central axis 505, by virtue of the arcuate movement of the second hub arm 548 about the central axis 505. Additionally, as the first and second end effectors 530, 532 are operatively connected to the central hub 536 through an upper rotatable hub and a lower rotatable hub respectively, the forks 537a, 537b of the end effectors 530, 532 may overlie one another in the vertical direction, for example to allow one of the forks 537a or 537b to receive and retract a substrate from a substrate support 672 while the other of the forks 537a or 537b is moving a different substrate inwardly of the processing module 250 to place a substrate on the substrate support 672 once the first substrate has been removed therefrom.

Each of the forks 537a, 537b of the first and second end effectors 530, 532 can extend a maximum distance from the central axis 505 when the arms (first arm 538 and first hub arm 542, or second arm 546 and second hub arm 548) thereof are co-aligned, i.e., when they together form a straight line path. In this orientation of the arms, one of the first and second fork 537a or 537b is at the load or unload position to receive or leave a substrate with respect to a substrate support 672. From this position, by virtue of arcuate movement of an upper or lower hub about central axis 505 and one of the first or the second arms 538, 546 about the corresponding first wrist axis $\Omega_1$ or second wrist axis $\Omega_2$, the corresponding fork 537a or 537b is retracted toward the central hub 536. By locating the dual arm robot 540 in processing module 250, and locating central axis 505 at the location of the central axis 253, the forks 537a, 537b are operable to access any substrate support 672 at any of the process stations 260A-F, and independently of one another. Thus, employing a robot of the structure of dual arm robot 540, a substrate can be moved from any of the process stations 260A-F to any other of the process stations 260A-260F without passing through any intermediate process station 260A-260F along the imaginary circle 252.

Figure 6:
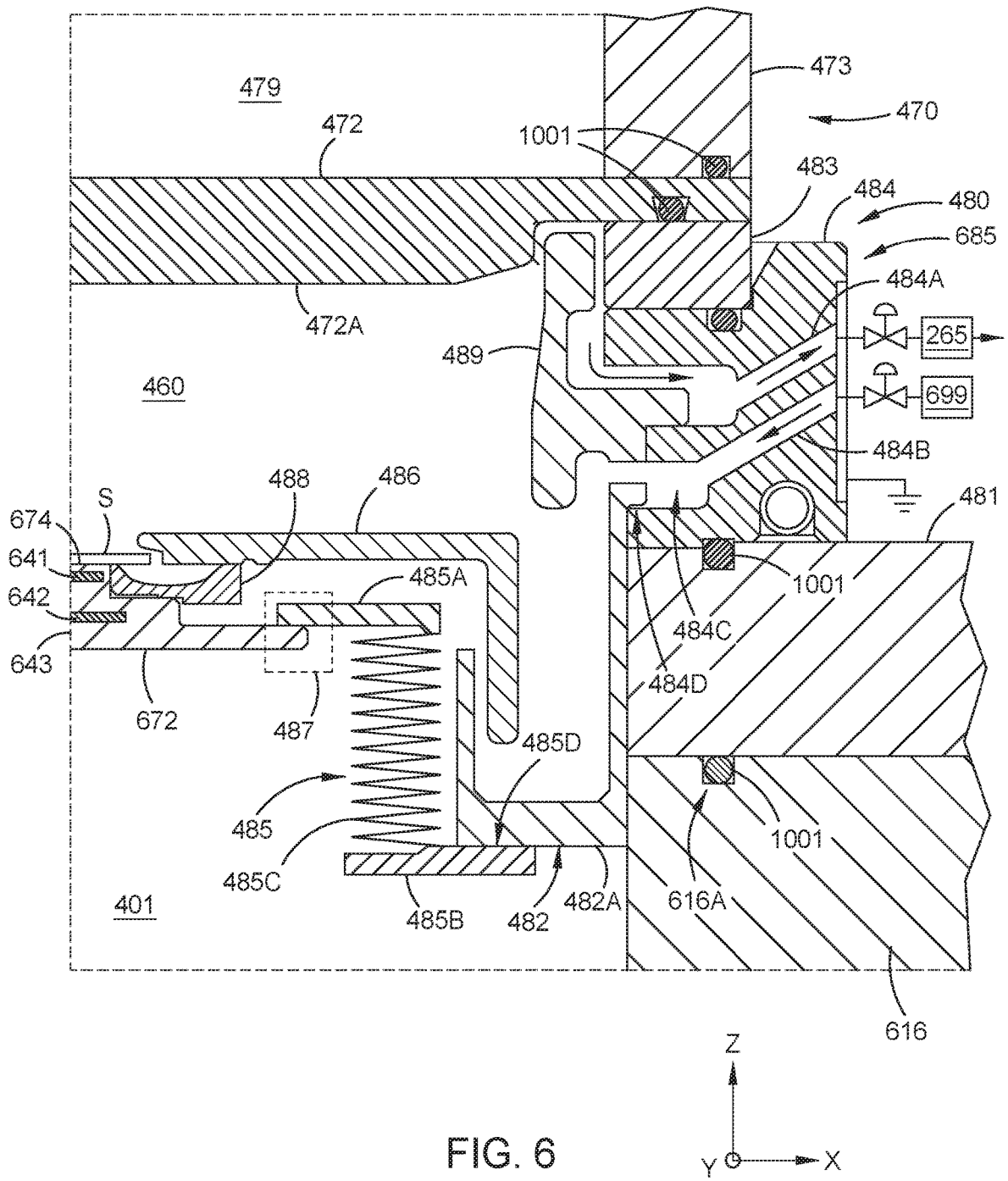
FIG. 6 is a partial cross-sectional view of a process station of the processing module of FIG. 4B, according to one or more embodiments.

FIGS. 4A-4B and 6, include cross-sectional views of portions of the process station 260F and processing module 250, and are intended to generally illustrate various components and attributes of a process station that can be positioned within a processing module 250. While the configuration of the process station 260F illustrated in these figures is adapted to perform a PVD deposition process, this process station configuration is not intended to be limiting as to the scope of the disclosure provided herein, since, as noted above, one or more of the process stations 260 within a processing module 250 can be adapted to perform a CVD, PECVD, ALD, PEALD, etch, thermal process (e.g., RTP, anneal, cool down, thermal management control) or other useful semiconductor or flat display panel substrate processing step. However, it is believed that processing modules 250 that primarily include or only include process stations that are configured to perform PVD deposition processes are advantageous in a number of semiconductor device forming applications over other processing module configurations that utilize other deposition and etching processes due to a reduced chance of process cross-contamination (e.g., smaller chance of residual gas cross-contamination) and the higher deposition rates commonly achieved by PVD processes.

The process station 260 generally includes a source assembly 470, a process kit assembly 480 and a substrate support actuation assembly 490, which when used together enable a desired process to be performed within a processing region 460 of the process station 260. In various embodiments of the disclosure provided herein, the processing region 460 within each of the process stations 260 is configured to be separately isolatable from the transfer region 401 of the processing module 250, and thus substantially prevent electromagnetic energy, vapors, gases or other undesirable contaminants from adversely affecting substrates and processes being performed in adjacent process stations or within the transfer region 401. When isolated from the transfer region 401, during a substrate processing step performed within a process station 260, the processing region 460 is generally enclosed by one or more processing surfaces of the source assembly 470, one or more processing region components 685 within the process kit assembly 480, and the substrate support 672.

As discussed above and shown in FIG. 4A, the source assembly 470 of the process station 260F is configured to perform a PVD deposition process. In this configuration, the source assembly 470 includes a target 472, a magnetron assembly 471, source assembly walls 473, a lid 474 and a sputtering power supply 475. In this configuration, a processing surface 472A of the PVD target 472 generally defines at least a portion of the upper portion of the processing region 460. The magnetron assembly 471 includes a magnetron region 479 in which the magnetron 471A is rotated by use of a magnetron rotation motor 476 during processing. The target 472 and magnetron assembly 471 are typically cooled by the delivery of a cooling fluid (e.g., DI water) to the magnetron region 479 from a fluid recirculation device (not shown). The magnetron 471A includes a plurality of magnets 471B that are configured to generate magnetic fields that extend below the processing surface 472A of the target 472 to promote a sputtering process performed in the processing region 460 during a PVD deposition process.

Alternate configurations of the process stations 260, which are adapted to perform CVD, PECVD, ALD, PEALD, etch, or thermal processes, the source assembly 470 will generally include different hardware components. In one example, the source assembly 470 of a process station that is adapted to perform a PECVD deposition process or etch process typically includes a gas distribution plate, or showerhead, that is configured to deliver a precursor gas or etching gas into the processing region 460 and across a surface of a substrate disposed within the process station 260 during processing. In this configuration, the one or more processing surfaces that define at least a portion of the processing region 460 is the lower surface of the gas distribution plate, or showerhead (e.g., surfaces that contact the processing region). In this configuration, the magnetron assembly 471 and target are not used, and the sputtering power supply 475 can be replaced with a RF power supply that is configured to bias the gas distribution plate.

The substrate support actuation assembly 490 includes a pedestal lift assembly 491 and a pedestal assembly 492. The pedestal lift assembly 491 includes a lift actuator assembly 768 and a lift mounting assembly 766, which is coupled to the lower wall 618 of the processing module 250. The lift actuator assembly 768 may include a stepper or servo motor actuated lead screw assembly, linear motor assembly, pneumatic cylinder actuated assembly or other conventional mechanical linear actuation mechanism. During operation the lift actuator assembly 768 and lift mounting assembly 766 are configured to position the pedestal assembly 492 in a transfer position (FIG. 4A), which is positioned vertically (Z-direction) below the support arms 308 (i.e., transfer plane), and a processing position (FIG. 4B), which is vertically above the support arms 308 by use of one or more mechanical actuators (e.g., servo motor, stepper motor, linear motor) found within the lift actuator assembly 768. The lift actuator assembly 768 is coupled to the pedestal shaft 492A, which is supported by bearings (not shown) that are coupled to the lower wall 618 to guide the pedestal shaft 492A as it is translated by the lift actuator assembly 768. A bellows assembly (not shown) is used to form a seal between the outer diameter of the pedestal shaft 492A and a portion of the lower wall 618, such that a vacuum environment created within the transfer region 401, by use of the vacuum pump 454, is maintained during normal operation. It is believed that the use of separate and dedicated pedestal lift assemblies 491, which are configured to accurately position a substrate S and a substrate support 672 in a desirable processing position in each process station 260, and can also be separately and desirably be aligned with the components within the source assembly 470 (e.g., target 472) within the process station 260, has significant advantage over conventional designs that position multiple substrates on a single supporting structure that do not allow separate alignment and adjustments to be made. An example of the importance and issues relating to positioning and alignment of the substrate S to the source assembly 470 components are discussed further below in conjunction with FIGS. 7A and 7B.

The pedestal assembly 492 includes a support plate assembly 494 that is coupled to plate support element 493 that is coupled to the pedestal shaft 492A. The pedestal assembly 492 includes a heater power source 498, an electrostatic chuck power source 499 and a backside gas source 497.

In some embodiments, the support plate assembly 494 includes a plurality of electrical contacts 496 (FIG. 4A) that are disposed on an upper surface of the support plate 494A. The heater power source 498 and electrostatic chuck power source 499 are each electrically coupled to two or more of the electrical contacts 496. The electrical contacts 496 are used to provide electrical power to the one or more electrical elements formed within the substrate support 672 when the substrate support 672 is lifted from the supporting portion 560 of the support arm 308 by the support plate 494A. The electrical contacts 496 are configured to mate with electrical contacts 673 formed on the lower surface of the substrate support 672. In some embodiments, a separate set of electrical contacts 673, which are formed on a lower surface of the substrate support 672, are configured to mate with the electrical contacts 496 of the support plate 494A. In one embodiment, the separate set of electrical contacts 673 are physically separated from the electrical contacts 673 that are configured to mate with the electrical contacts 453 of the support arms 308. In this configuration, the substrate support 672 includes two separate sets of contacts that are each adapted to create a similar electrical connection to the electrical elements (e.g., resistive heating elements, chucking electrodes) embedded within the substrate support 672.

The resistive heating elements disposed within the substrate support 672 are coupled to two or more electrical contacts 673 that are in electrical communication with two or more electrical contacts 496 of the support plate 494A that are coupled to the output of the heater power source 498 when the substrate support 672 is positioned in a processing position (FIG. 4B). The one or more chucking electrodes disposed within the substrate support 672 are coupled to two or more electrical contacts 673 that are in electrical communication with two or more electrical contacts 496 of the support plate 494A. In one example, three wires that are coupled to the output of the heater power source 498 and two wires that are coupled to the electrostatic chuck power source 499 are provided through pedestal shaft 492A so that they can be separately connected to their respective mating electrical contact 496. In some embodiments, a reliable separable electrical connection is formed between the electrical contacts 496 and their respective mating electrical contacts 673 due at least in part to a portion of the weight of the substrate support 672 being allowed to cause a surface of the electrical contact 673 to bear against a mating surface of each of the electrical contacts 496 when the substrate support 672 is positioned in the processing position within the process station 260. Thus, allowing a substrate to be chucked and heated by the substrate support 672 while it is positioned on the support plate 494A during processing.

In some embodiments, the support plate assembly 494 includes a separable backside gas connection 495 that is configured to mate with a backside gas receiving surface formed around a backside gas port 671 formed in the backside of the substrate support 672. The backside gas connection 495 is coupled to the backside gas source 497, which is configured to deliver a backside gas (e.g., N$_2$, He, Ar) to the backside gas port 671 formed in the substrate support 672 that is connected to gas passages formed in the substrate support 672 and to a space formed between a substrate positioned on a substrate receiving surface of the substrate support 672 and the substrate support 672 during processing. The separable backside gas connection 495 is thus configured to be repeatedly sealably connected to the backside gas receiving surface of the substrate support 672 when the substrate support 672 is positioned on the support plate 494A and to be detached from the substrate support 672 when the support plate 494A is in a transfer position (i.e., below the support arm 308). In some embodiments, the separable backside gas connection 495 includes a machined metal or compliant sealing surface that is configured to mate with a polished mating surface of the backside gas receiving surface to form a repeatable gas tight seal that is at least partially formed by a portion of the weight of the substrate support 672 bearing on the surface of the separable backside gas connection 495 when the substrate support 672 is positioned in the processing position within the process station 260.

The process kit assembly 480, as shown in FIGS. 4A-4B and 6, generally includes a plurality of processing region components 685 and a sealing assembly 485 that are positioned over and/or within an upper process station openings 734 of the chamber upper wall 616 of the processing module 250. In the process station 260 configuration example disclosed in FIGS. 4A-4B and 6, the processing region components 685 include a base plate 481, process region shield 482, isolation ring 483, station wall 484, cover ring 486, deposition ring 488, and inner shield 489, which together at least partially define the processing region 460 of a process station 260. The base plate 481 is configured to support the process region shield 482, isolation ring 483, station wall 484, sealing assembly 485, cover ring 486, deposition ring 488, and inner shield 489, and allow these components to be positioned on and removed as one assembly from the central opening 713 formed in the upper wall 616 of the processing module 250. The isolation ring 483, which is formed from a dielectric material, is configured to support the target 472 and be position on the station wall 484 that is positioned on the base plate 481. The isolation ring 483 is used to electrically isolate the target 472, when it is biased by the sputtering power supply 475, from the grounded station wall 484.

The process kit assembly 480 also includes a plurality of sealing elements 1001 (e.g., O-rings) that are used to prevent atmospheric gases from entering the processing region 460 during normal processing. Moreover, the source assembly 470 is configured to form a seal with a portion of the process kit assembly 480 by use of a sealing element 1001 and the process kit assembly 480 is configured to form a seal with the upper surface of the chamber upper wall 616 similarly by use of a sealing element 1001 to allow the processing region 460 to be isolated from the external environment during processing.

The station wall 484 includes a first port 484A that is coupled to a vacuum pump 265 and is configured to evacuate the processing region 460 through a circumferential gap formed between an upper portion of the shield 489, lower surface of the target 472 and portion of the isolation ring 483 and station wall 484 during processing. The station wall 484 also includes a second port 484B that is coupled to a gas source 699, and is configured to deliver one or more process gases (e.g., Ar, N$_2$) to the processing region 460 through a circumferential plenum 484C during processing.

The process region shield 482 is positioned on a lower portion of the station wall 484. The process region shield 482 is typically used to collect deposition sputtered from the target 472, enclose a portion of the processing region 460, and in some configurations, as shown in FIG. 6, support the sealing assembly 485. In this configuration, the process region shield 482 is adapted to form a seal at a surface 484D of the station wall 484 on which it is supported, and similarly form a seal between a surface 485D of the lower plate 485B of the sealing assembly 485 and a lower surface 482A of the process region shield 482. The seals formed between the process region shield 482 and portions of station wall 484 and lower plate 485B can each be formed by use of an O-ring (not shown), welding or other conventional sealing method.

In some embodiments, the sealing assembly 485 includes an upper plate 485A, a lower plate 485B, and a compliant member 485C disposed between the upper plate 485A and lower plate 485B. In some embodiments, as shown in FIG. 6, the compliant member 485C includes a flexible bellows assembly that is configured to be compliant in at least one direction, such as the vertical direction (i.e., Z-direction), and is configured to prevent gases from passing therethrough during processing. The flexible bellows assembly may be a stainless steel or Inconel bellows assembly that is sealably welded at opposing ends to the upper plate 485A and lower plate 485B.

During processing, when the substrate and substrate support 672 are positioned in a processing position below the source assembly 470, as shown in FIGS. 4B and 6, a portion of the substrate support 672, or component attached thereto, both of which are referred to herein as a "sealing portion" of the substrate support 672, is adapted to form a "seal" with a portion of the sealing assembly 485 so as to substantially fluidly isolate the processing region 460 from the transfer region 410. Thus, in the process station 260 configuration example disclosed in FIGS. 4A-4B and 6, the substrate support 672, target 472, sealing assembly 485, and plurality of processing region components 685, which include the process region shield 482, station wall 484, and isolation ring 483, substantially enclose and define the processing region 460. In some embodiments, the "seal" formed between the sealing portion of the substrate support 672 and the upper plate 485A of the sealing assembly 485 is created at a sealing region 487 that is formed by physical contact between a surface of the sealing portion of the substrate support 672 and a surface of the portion of the sealing assembly 485. In some lower temperature applications, the seal is formed by use of wiper seal, u-cup seal or an O-ring (not shown) that is positioned at the interface between the surface of the sealing portion of the substrate support 672 and the surface of the portion of the sealing assembly 485. In some high temperature applications, such as at temperatures greater than 200° C., the seal is formed by metal-to-metal, or metal-to-ceramic contact formed at the interface between the sealing portion of the substrate support 672 and the portion of the sealing assembly 485. In some embodiments, the flexible bellows assembly of the sealing assembly 485 is configured to be extended in the vertical direction as the sealing portion of the substrate support 672 is placed in contact with the surface of the portion of the sealing assembly 485 by use of the lift actuator assembly 768 in the substrate support actuation assembly 490. The compliant nature of the flexible bellows assembly allows any misalignment or planarity differences between the surface of the sealing portion of the substrate support 672 and the surface of the portion of the sealing assembly 485 to be taken up so that a reliable and repeatable seal can be formed at the sealing region 487 over many cycles. As illustrated in FIGS. 4A-4D and 6, the substantially parallel orientation/alignment of the sealing portion of the substrate support 672, the sealing portion of the sealing assembly 485, the processing surface of the substrate and lower surface of the source assembly 470 (e.g., lower surface of the target 472) also allows a repeatable reliable seal to be formed while also allowing the angular alignment between the processing surface of the substrate and lower surface of the source assembly 470 to be easily formed and/or maintained during processing. Issues relating to angular misalignment between the processing surface of the substrate and lower surface of the source assembly 470 are discussed further below in conjunction with FIGS. 7A-7B and 8.

However, in some alternate embodiments, the sealing assembly 485 simply comprises a wiper seal, u-cup seal or an O-ring (not shown) that is positioned at the interface between a sealing surface of the substrate support 672 and the lower surface 482A of the process region shield 482 to form a seal therebetween when the substrate support 672 is positioned in the processing position. In this configuration, the portion of the substrate support 672 on which the sealing surface is formed has a diameter that is larger than the inner diameter of the process region shield 482 so that the seal can be formed between the sealing surface and the lower surface 482A while the substrate support is positioned in the processing position during a processing step.

After performing the substrate processing step(s) in a first process station 260, the substrate S and substrate support 672 are lowered so that they are located on the support arm 308. The central transfer robot 245 then rotates the central support 305 about the central axis 253 extending therethrough to swing the support arm 308, substrate S and substrate support 672 through an arc to index the substrate support 672 and substrate S to a position below a second process station 260, where the substrate S is again lifted on the same substrate support 672 by a pedestal lift assembly 491, which is dedicated to that second process station 260, to the processing position. After processing is completed on the substrate S, the substrate S and substrate support 672 are then placed back onto the end of the support arm 308 and transferred to the next process station 260. The processing cycle of raising the substrate S and substrate support 672, processing the substrate S, lowering the substrate S and substrate support 672 and transferring the substrate support 672 and substrate S can then repeated multiple times.

During the substrate S and substrate support 672 transferring sequence within the processing module 250, the processing regions 460 of each of the process stations 260 are in direct communication with the transfer region 401. This structural design, while reducing system cost due to the removal of the need for dedicated slit valves isolating each process station from a transferring region found in more conventional designs and thus also reducing substrate transfer overhead time (i.e., increasing throughput) due to the reduced number of steps required to transfer a substrate, also allows the pressures between the processing regions 460 and transfer region 401 to be equilibrated and a desired base pressure to be more easily and rapidly achieved across the processing module 250. The system design disclosed herein also reduces the complexity and cost by eliminating the need for separate processing chamber structures (e.g., separate welded compartments) and supporting hardware (e.g., individual support frame, slit valve, etc.) needed in conventional processing system designs. Moreover, this design and transfer sequence also provides additional advantages since the processing regions 460 of each process station 260 can be separately and selectively isolated by controlling the movement and position of the substrate support 672 by the substrate support actuation assembly 490 positioned at each process station 260 based on commands sent from the system controller 299 (FIG. 2A). For example, it may be desirable to separately process a substrate in process stations 260A and 260B by positioning the substrates S and substrate supports 672 in processing positions within these process stations, while process stations 260C, 260D, 260E and 260F remain in a non-isolated state due to the substrate supports 672 at these positions remaining in a transfer position and thus allowing the fluid communication between the processing regions 460 and the transfer region 401 at these process stations.

Figure 4C:
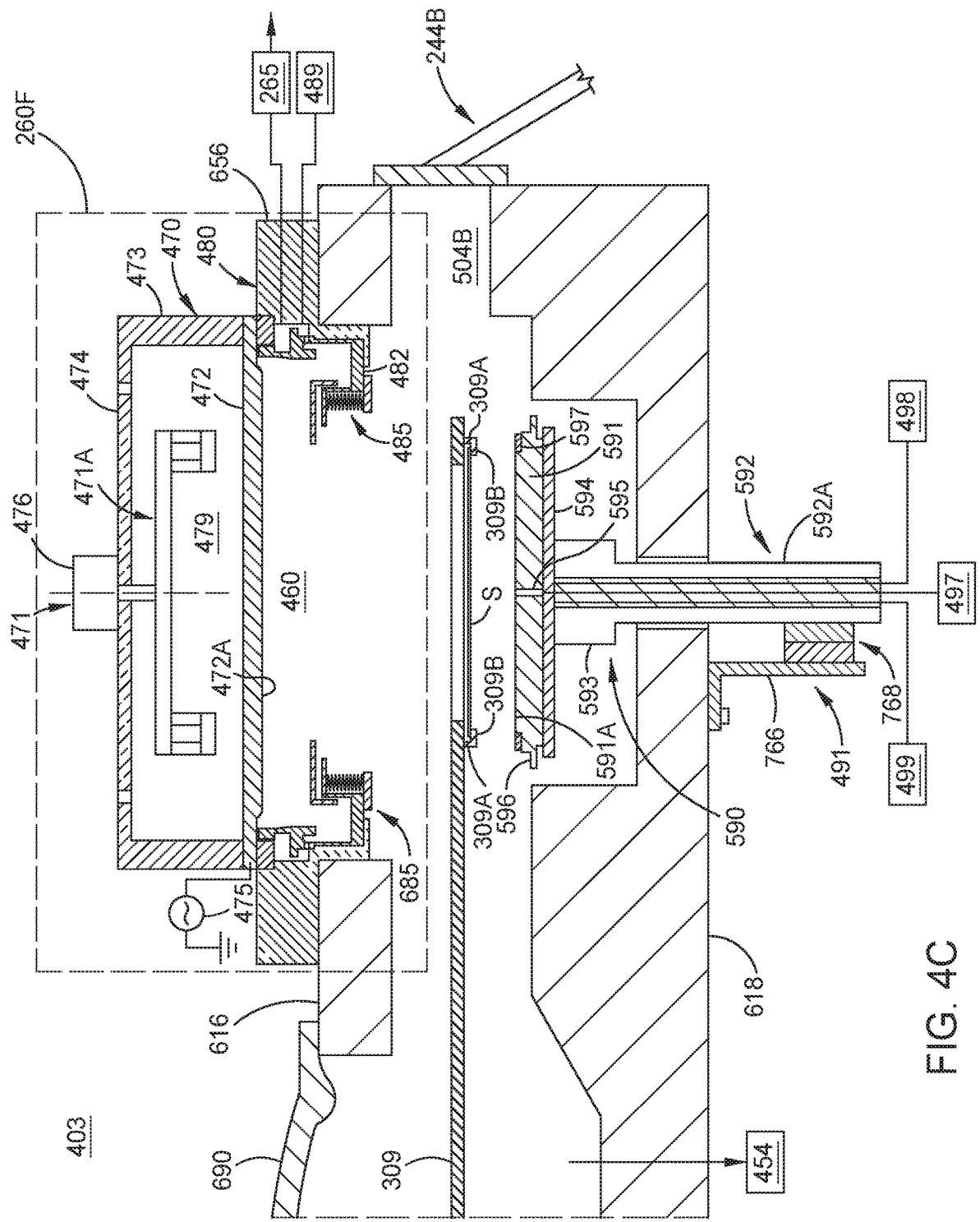
FIG. 4C is a partial sectional view of a portion of the processing module of FIG. 2A, showing an alternate configuration of a substrate support in a transfer position below a process station of the processing module, according to one or more embodiments.
Figure 4D:
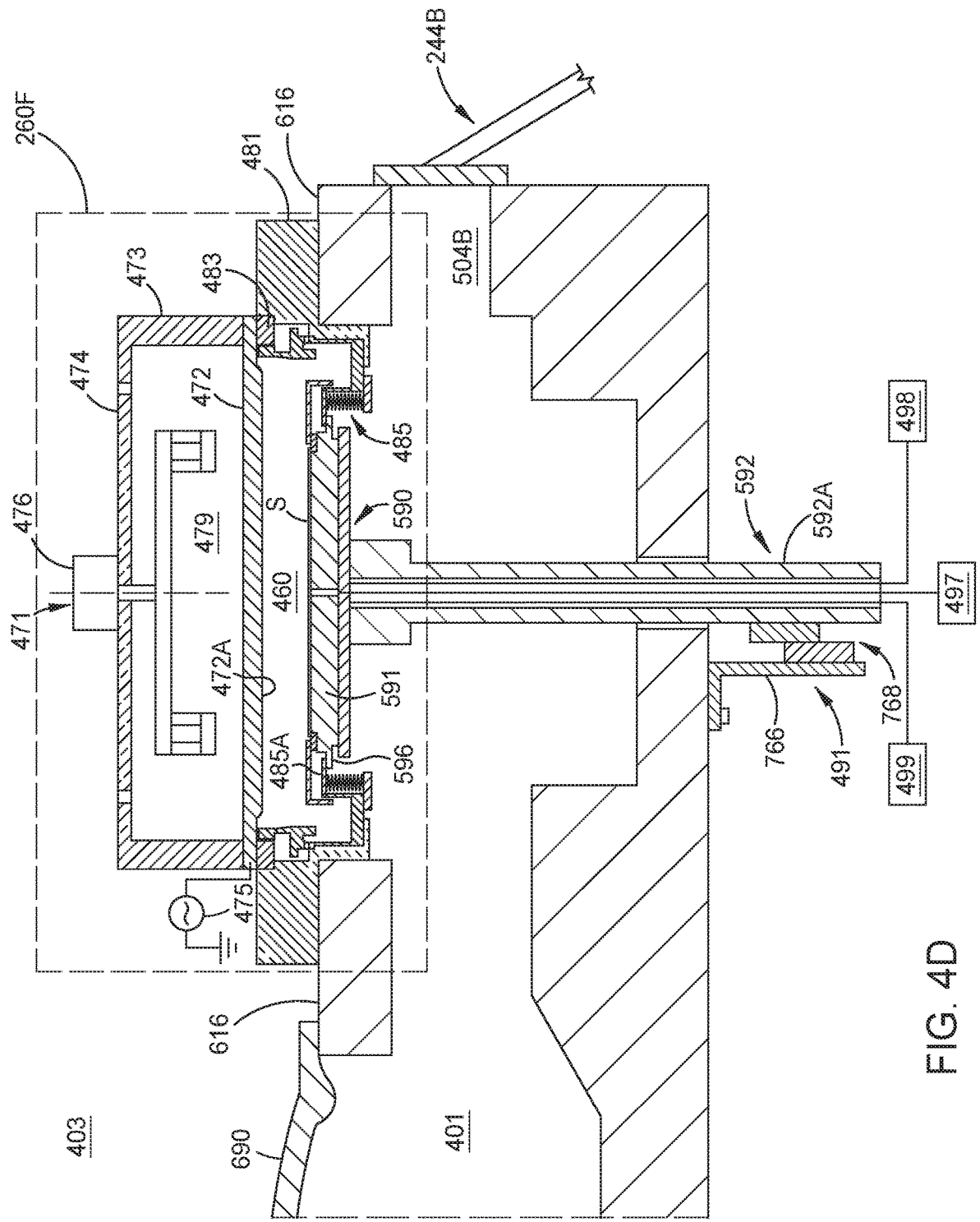
FIG. 4D is a partial cross-sectional view of the processing module of FIG. 2A, showing an alternate configuration of the substrate support illustrated in FIG. 4C lifted into a process position to form a sealed substrate process volume therewith, according to one or more embodiments.

FIGS. 4C-4D are schematic cross sectional views of a processing module 250 that includes an alternately configured version of process station 260F, according to an embodiment. In this configuration, the processing module 250 includes an alternately configured central transfer robot 245 that includes a plurality of support arms 309 that are configured to transfer and deposit one or more substrates onto a substrate support surface 591A of a support chuck assembly 590. The substrate support surface 591A is formed on the support chuck assembly 590 that is attached to the pedestal lift assembly 491.

FIG. 4C illustrates the support chuck assembly 590 that is positioned in a substrate receiving position or substrate transfer position. FIG. 4D illustrates the support chuck assembly 590 while it is positioned in a substrate processing position. The support chuck assembly 590 configurations illustrated in FIGS. 4C-4D illustrate a design in which a substrate supporting element 591 of the support chuck assembly 590 remains attached to the pedestal lift assembly 491 components such that it is dedicated to a single process station 260, and is limited to moving a substrate vertically, such as moving the substrate between the substrate receiving position and the processing position.

The support chuck assembly 590 includes a plate support 594, which is configured to support and retain the substrate supporting element 591 and is coupled to a pedestal shaft 592A. The support chuck assembly 590 includes a heater power source 498, an electrostatic chuck power source 499 and a backside gas source 497. The heater power source 498 and/or electrostatic chuck power source 499 are each electrically coupled the one or more electrical elements formed within the substrate supporting element 591. In this configuration, the body of the substrate supporting element 591 includes one or more resistive heating elements embedded therein. The resistive heating elements are disposed within the body of the substrate supporting element 591 and are in electrical communication with the output connections of the heater power source 498. The one or more chucking electrodes disposed within the body of the substrate supporting element 591 are in electrical communication with the power source 499. In one example, three wires that are coupled to the output of the heater power source 498 and two wires that are coupled to the power source 499 are provided through pedestal shaft 592A so that they can be separately connected to their respective electrical elements.

The support chuck assembly 590 includes a backside gas port 595 formed in the substrate supporting element 591. The backside gas port 595 is coupled to the backside gas source 497, which is configured to deliver a backside gas (e.g., $N_2$, He, Ar) to gas passages formed in the substrate supporting element 591 and to a space formed between a substrate and the surface of the substrate supporting element 591 during processing.

As similarly discussed above, during processing, when the substrate and support chuck assembly 590 are positioned in a processing position below the source assembly 470 (FIG. 4D), a portion of the support chuck assembly 590, or component attached thereto, includes a sealing surface 596 that is adapted to form a "seal" with a portion of the sealing assembly 485 so as to substantially fluidly isolate the processing region 460 from the transfer region 410. In some embodiments, the "seal" formed between the sealing surface 596 and the upper plate 485A of the sealing assembly 485 is created within the sealing region 487 by the physical contact created between a surface of the sealing surface 596 and a surface of the portion of the sealing assembly 485. As similarly discussed above, in some lower temperature applications, the seal is formed by use of wiper seal, u-cup seal or an O-ring (not shown) that is positioned at the interface between the sealing surface 596 of the support chuck assembly 590 and the surface of the portion of the sealing assembly 485. Also, in some high temperature applications, such as at temperatures greater than 200° C., the seal is formed by metal-to-metal, or metal-to-ceramic contact formed at the interface between the portion of the sealing surface 596 of the support chuck assembly 590 and the portion of the sealing assembly 485.

Referring to FIG. 4C, the central transfer robot 245 includes a plurality of support arms 309 that are configured to pick-up and deposit one or more substrates onto the substrate support surface 591A of a support chuck assembly 590. In one embodiment, the central transfer robot 245 includes a lift actuator 599 that is configured to at least raise and lower the central support 305 and plurality of support arms 309 attached thereto in a Z-direction from a transfer position to a substrate drop off position, which is below the transfer position. The support arm 309 is similarly mounted, shaped and configured as the support arm 308 described above, except that it is configured to transfer substrates between process stations 260, versus substrates and substrate supports 672 between process stations 260. In one embodiment, each support arm 309 includes a plurality of substrate supporting elements 309A that are positioned on an underside surface of the support arm 309 so that a substrate supported on the supporting surface 309C of the substrate supporting elements 309A can be positioned directly on the supporting surface 591A of the substrate supporting element 591. The inner edges 309B of opposing substrate supporting elements 309A are positioned a distance apart that is less than the smallest possible outer dimension of the substrate to assure that all possible substrates can be received and transferred by the support arm 309. A cut-out (not shown) in the upper surface and upper portion of the substrate supporting element 591 is configured to mate with the orientation of the substrate supporting elements 309A so that the substrate supporting elements 309A do not contact or interfere with the substrate supporting element 591 after the substrate is disposed on the supporting surface 591A and so that the support arm can be rotated about the central axis 253 to move the support arm 309 to a position that is not over the support chuck assembly 590.

A similar robot arm configuration, or end of a robotic arm, as the substrate supporting elements 309A portion of the support arm 309 may also be utilized as part of the end effector of the intermediate robot 285A, 285B to pick-up and drop-off substrates on the supporting surface 591A of the substrate supporting element 591, or alternately the supporting surface 674 of the body 643 of the substrate support 672. Similarly, as discussed above, in one embodiment, the intermediate robot 285A, 285B includes a lift mechanism (not show) that is configured to at least raise and lower the end effector (not shown) of the intermediate robot 285A, 285B to and from a transfer position and a substrate drop off position, which is below the transfer position. One or more cut-outs (not shown) in the upper surface and upper portion of the substrate supporting element 591, or substrate support 672, is configured to mate with the orientation of the substrate supporting elements 309A positioned on the end effector (not shown) of the intermediate robot 285A, 285B so that the substrate supporting elements 309A do not contact or interfere with the substrate supporting element 591 or substrate support 672 after the substrate is disposed thereon and the end effector is retracted from a position that is not over the support chuck assembly 590 or substrate support 672.

Processing systems 200 that include the use of robot end effectors that have supporting elements like the supporting elements 309A illustrated in FIG. 4C have been found to be useful since they allow substrates to positioned on the substrate supporting surface of the substrate support 672 or support chuck assembly 590 without the need for the use of a separate substrate lift assembly (e.g., lift pins, lift hoop and lift actuator) commonly used in the art to separate a substrate from the substrate supporting surface during substrate exchange operations. While reducing the cost and complexity of the process stations 260, use of this type of robot end effector also removes the need to form holes within the substrate support 672 or support chuck assembly 590 that are required to allow the lift assembly components (e.g., lift pins) access the substrate disposed on the substrate receiving surface, and then also removes the need to seal the holes formed in the substrate support 672 or support chuck assembly 590 in an effort to fluidly isolate the processing region 460 from the transfer region 401 during processing. Therefore, in one or more of the embodiments described herein, the substrate support 672, or support chuck assembly 590, does not include through holes used to accept substrate lift components (e.g., lift pin holes), and may in some cases only include a single through hole used to provide a backside gas to a substrate during processing, such as the backside gas port 671, or backside gas port 595.

While the alternate process station configuration illustrated in FIGS. 4C-4D includes a substrate transferring sequence that does not include the movement of the substrate support with the substrate, the processing module 250 in this case still includes the same basic transfer region 401 and processing region 460 structural configuration and advantages described above. For example, the processing regions 460 of each process station 260 can be separately and selectively isolated by controlling the movement and position of the support chuck assembly 590 by the substrate support actuation assembly 490 at each process station 260 based on commands sent from a system controller 299 (FIG. 2A).

As discussed above in conjunction with FIGS. 1A and 1B, each process station 260A-260F is configured to separately perform a desired process on a substrate. In one example, a deposition process is separately performed in a plurality of process stations within the processing module 250. The separately performed deposition process may include sequentially depositing, via a PVD process, a layer on a substrate as it is sequentially processed in process stations 260A-260F. During a PVD deposition process, or sputtering process, a bias is applied to the target 472 by the power supply 475. The bias applied to the target causes a portion of the target material to be ejected from the face of the target 472 due to ionized gas atoms, formed by the applied bias delivered to a sputtering gas provided from the gas source 699, bombarding the surface of the target. The flux of the ejected, or sputtered material, includes ionized and neutral atoms of target material that generally travel towards the lower portion of the formed processing region 460, and to the surface of the substrate S and shields (e.g., inner shield 489, process region shield 482) of the process kit assembly 480. The direction of the flux of the ionized target atoms ejected from the surface of the target 472 can be altered by grounding, applying a direct current (DC) or radio frequency (RF) bias to one of the electrodes formed in the substrate support 672. Thus, in some embodiments, the heater power source 498 and electrostatic chuck power source 499 include a DC or RF power supply that is configure to apply a bias to the one or more chucking electrodes or heating element(s) disposed within the substrate support 672. The chucking electrodes disposed within the substrate supporting element 591 are generally positioned just below (e.g., 0.1 mm-1 mm) the dielectric material disposed at the substrate supporting surface of the substrate support 672. However, due to the inability to ionize all of the sputtered atoms during processing and the structural configuration of the PVD chamber, a PVD process is considered to be a line-of-sight deposition process, which from a within-wafer (WIW) deposition uniformity perspective, is affected by the shape of the target and parallelism of the target 472 to the surface of the substrate during the PVD deposition process. In one example, a smaller target-to-substrate spacing at one edge of a substrate relative to an opposing edge of a substrate will cause a thickness variation across the substrate due to the angular misalignment. Therefore, as is discussed below in relation to FIGS. 7A-7B, the distortion of the chamber upper wall 616 and lower wall 618, due to the pressure difference created between an external ambient pressure region 403 (FIG. 4A) and the transfer region 401 and processing region 460, tend to cause the surface of the target 472 to deflect and become angled relative to the surface of the substrate support 672 during processing versus when a vacuum pressure is not provided within the transfer region 401 and processing region 460, such as occurring during maintenance activities. The deflection of the targets 472 within each of the process stations 260 also increases as the size of the processing module 250 increases as substrate sizes increase (e.g., 300 mm), due to the large overall span the chamber upper wall 616 and lower wall 618 need to extend within the X-Y plane (e.g., >3 m diameter) to allow the substrates to be positioned within the transfer region 401 and transferred between the process stations 260. In an effort to minimize the effect of distortion of the chamber upper wall 616 and lower wall 618, a structural support assembly 710 is used to minimize the distortion of the chamber upper wall 616 and lower wall 618 and improve the parallelism of the source assemblies 470 of the process stations 260A-260F to each other whether the processing module 250 is under vacuum (e.g., 10 Torr to $10^{-8}$ Torr) or at ambient pressure (e.g., 760 Torr).

After performing the PVD processing steps in the process station 260, the bias voltage on the target 472 is returned to zero, the generated plasma dies out, and, as discussed above in conjunction with the embodiments illustrated in FIGS. 4A and 4B, the substrate S and substrate support 672 is lowered to be located back on the support arm 308.

In addition to the deposition processes one or more target pasting processes (e.g., cleaning an oxide layer or a reactive sputtering formed layer off of the surface of the target) and/or a chamber clean process can additionally be performed in a process station. In one example, during a pasting process a pasting disc and/or shutter disc (e.g., a substrate sized metal disk) is positioned on the pedestal lift assembly 491 and moved into a processing position by the pedestal lift assembly 491 to allow a PVD deposition process to be performed on the pasting disc and/or shutter disc instead of a substrate to clean the surface of the target 472.

Figure 7A:
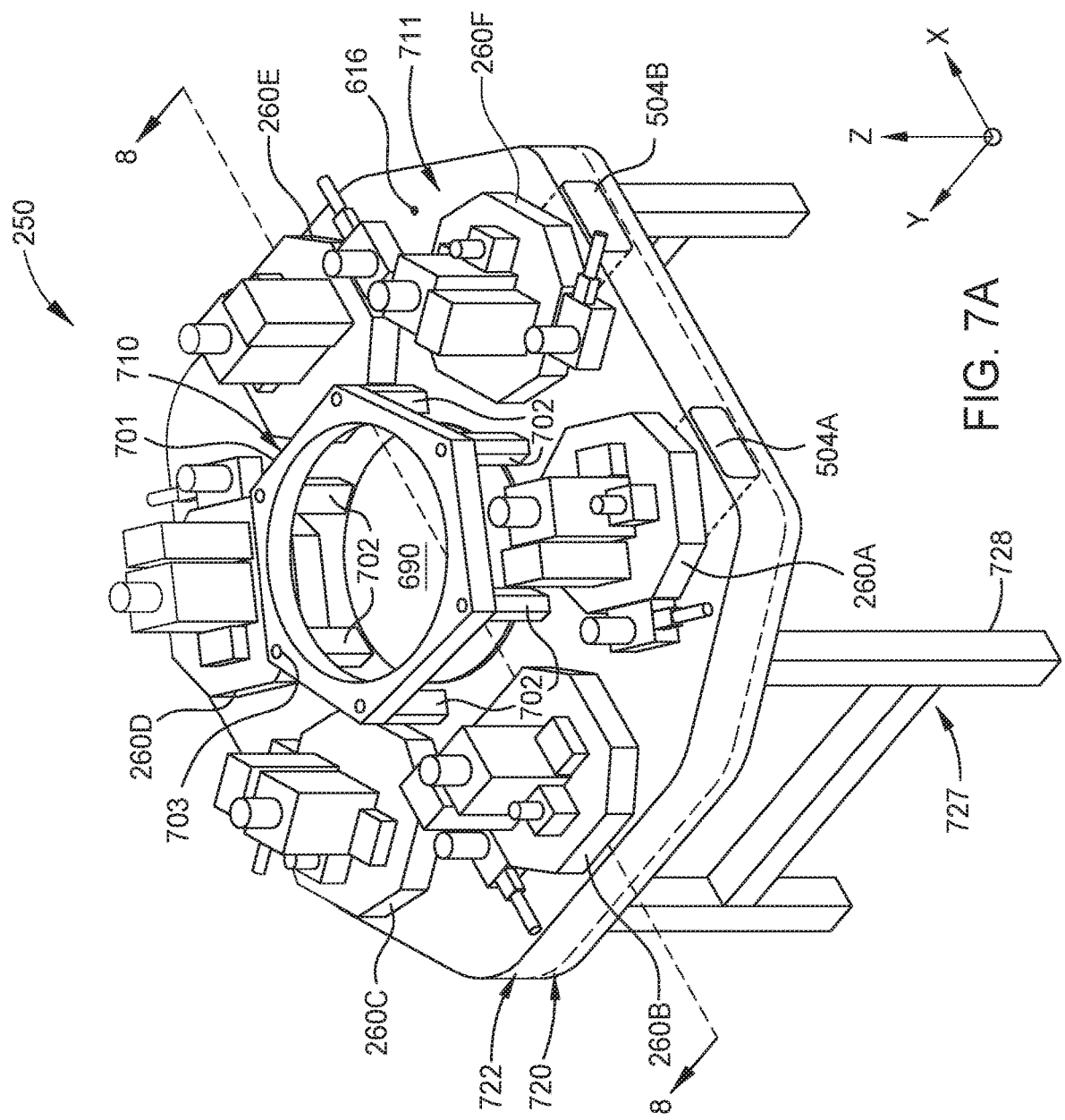
FIG. 7A is an isometric view of a processing module that includes a structural support assembly useful to maintain co-planarity of a processing surface of source assemblies and substrate support surfaces disposed within the processing module, according to one or more embodiments.
Figure 7B:
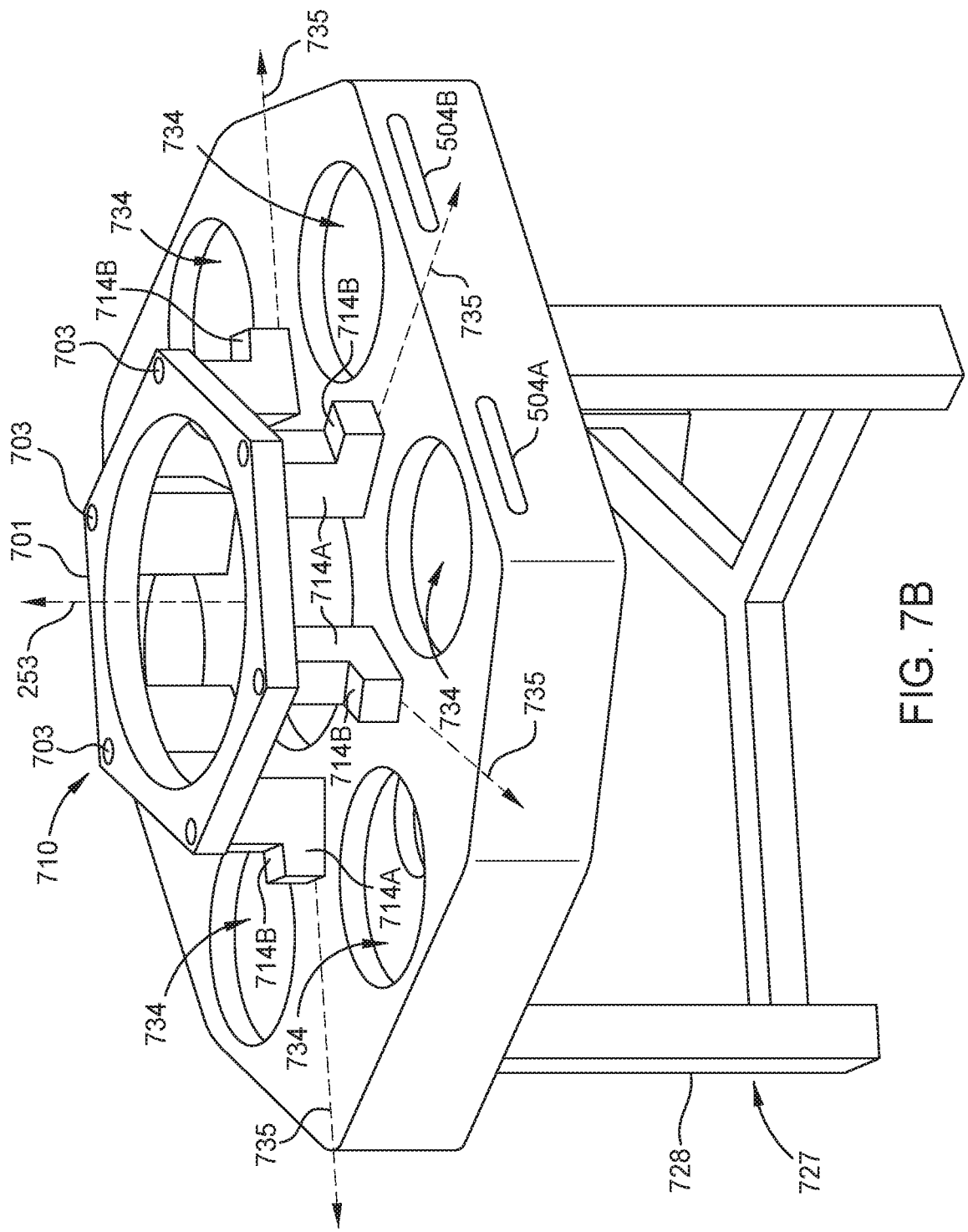
FIG. 7B is a close-up isometric view of the structural support assembly disposed on a chamber upper wall of the processing module illustrated in FIG. 7A, according to one or more embodiments
Figure 8:
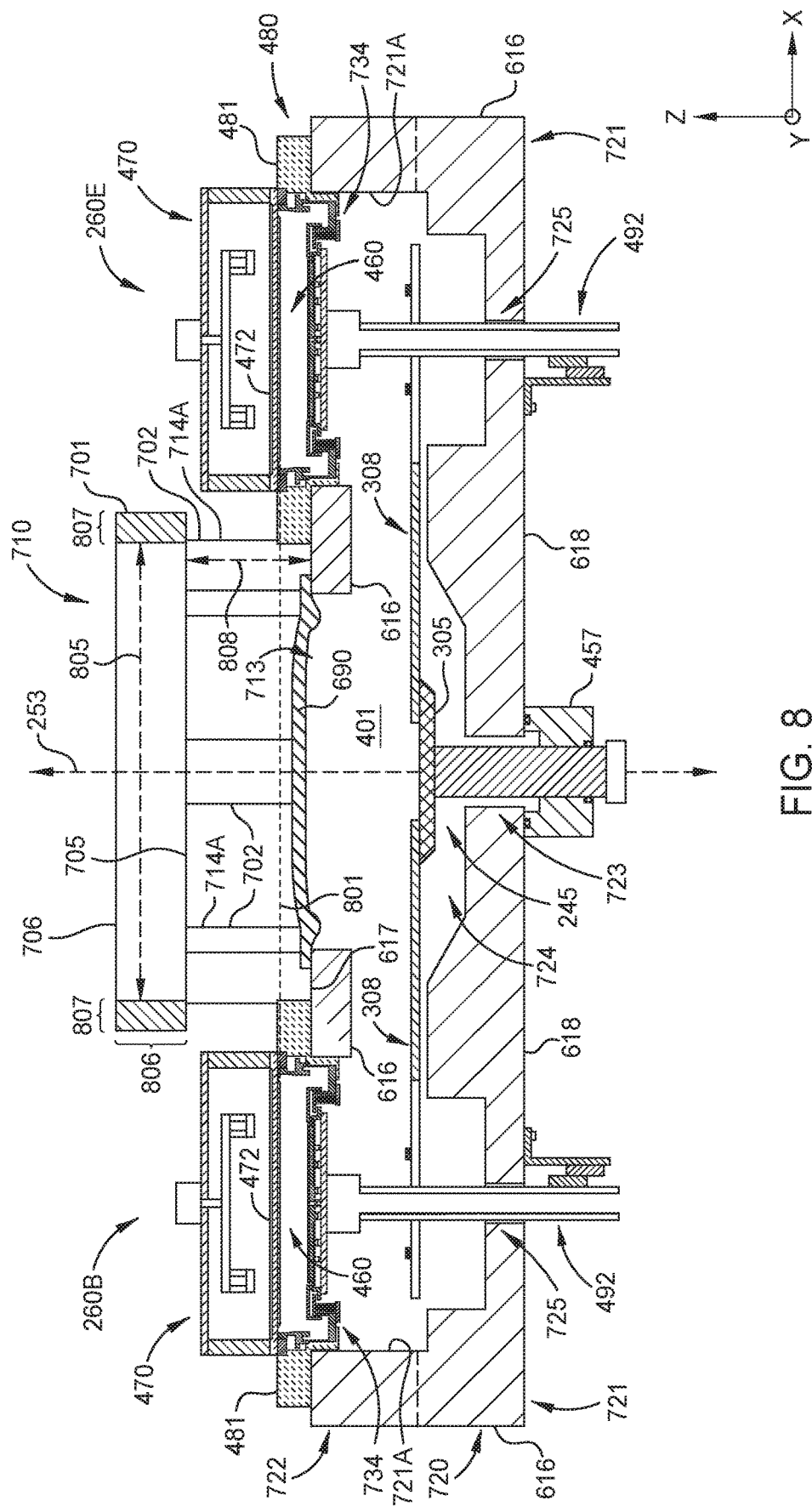
FIG. 8 is a side cross-sectional view of the processing module formed along the sectioning line 8-8 illustrated in FIG. 7A, according to one or more embodiments.

Referring now to FIGS. 7A, 7B and 8, further structure and details of the processing module 250 are shown. Here, as shown in FIG. 7A, processing module 250 includes a lower monolith 720 forming the lower portion or base of the processing module 250, and an upper monolith 722 that is sealed thereto and supported thereon. In some embodiments, lower monolith 720 and the upper monolith 722 are welded, brazed or fused together by some desirable means to form a vacuum tight joint at the interface between the lower monolith 720 and the upper monolith 722. In some embodiments, the lower monolith 720 has a generally plate like structure that has seven side facets (FIG. 2A), and includes the lower wall 618 that includes a central opening 723 disposed within a central recess 724 (FIG. 8) disposed within a central region, and a plurality of lower process station openings 725 (two shown in FIG. 8), each corresponding to the location of a process station 260. A plurality of pedestal assemblies 492, two of which are shown in FIG. 8, extend through and downwardly from the lower wall 618. A lower supporting structure 727, which includes a support frame 728, is used to support the lower monolith 720 and the upper monolith 722 and position the processing module 250 at a desired vertical position above a floor (not shown).

In some embodiments, the upper monolith 722 has a generally plate like structure that has eight side facets (FIG. 2A) that match those of the lower monolith 720. An upper main portion 711, which includes the chamber upper wall 616, includes a central opening 713 (FIG. 8) disposed within a central region, and a plurality of upper process station openings 734 (FIGS. 4A-4D, 7B and 8), each corresponding to the location where the process kit assembly 480 and source assembly 470 of the process station 260 are positioned. It has been found that forming a central opening 713 in the chamber upper wall 616 such that the diameter of the central opening 713 falls within a diameter ratio, which is defined by a ratio of the diameter of the central opening to a diameter of the outer extent of transfer region 401 at the inner surface 721A of the perimeter region 721 (i.e., unsupported length of the chamber upper wall 616), to less than about 0.5 and greater than 0.3 allows user accessibility to the central region of the processing module 250 through the central opening 713 and surprisingly not adversely increasing the distortion of the chamber upper wall 616 during processing (e.g., under vacuum) due to the material removed from the center of the chamber upper wall 616. In this configuration, the removable central cover 690 extends over the central opening 713, but is generally not coupled to or used to provide additional structural support to the chamber upper wall 616. The removable central cover 690 includes a seal (not shown) that prevents the external environmental gases from leaking into the transfer region 401 when the transfer region 401 is maintained in a vacuum state by the vacuum pump 454. The inner surface 721A of a perimeter region 721 of the lower monolith 720 and the upper monolith 722 forms the outer edge of the transfer region 401. The access openings 504A, 504B extend through a portion of the inner surface 721A and through either a portion of a wall of the upper monolith 722 (FIG. 4A-4D) or a portion of a wall of the lower monolith 720 (not shown).

As discussed above, the distortion of the chamber upper wall 616 and lower wall 618, due to the pressure difference created between an ambient pressure region 403 and the transfer region 401 and processing region 460, tends to cause the portions of the source assemblies 470 (e.g., surfaces of the targets 472) to deflect and become angled relative to the surface of the substrate support 672 during processing. In an effort to minimize the distortion of the chamber upper wall 616 and lower wall 618, a structural support assembly 710 is used to minimize the distortion of the chamber upper wall 616 and/or lower wall 618 and improve the parallelism of the source assemblies 470 whether the processing module 250 is under vacuum or at ambient pressure. Due to manufacturing limitations, cost limitations and limitations regarding the shipment of the assembled upper monolith 722 and lower monolith 720, the chamber upper wall 616 typically has an average wall thickness (Z-direction) that is between 50 millimeters (mm) and 100 mm, and also to the lower wall 618 has an average wall thickness (Z-direction) that is between 75 mm and 150 mm. Here, to help ensure this parallelism, the upper monolith 722 includes the structural support assembly 710 that includes an upper support element 701 and a plurality of mounting elements 702 that each have a first end that is coupled to the chamber upper wall 616. In some embodiments, the first end of the mounting elements 702 are coupled to the chamber upper wall 616 by bolting, welding, or even integrally forming the mounting elements 702 as part of the chamber upper wall 616. The array of mounting elements 702 are positioned on and coupled to the chamber upper wall 616 between each of the process stations 260. In some embodiments, the array of mounting elements each have a first end that is coupled to the first wall at a radial position that is positioned on a radial direction 735 that extends between two adjacent process station openings. In one example, as shown in FIG. 7B, the radial position of each of the mounting elements is positioned along a radial direction 735 that extends between each pair of process station openings and are positioned at a radial position that is inboard (e.g., smaller radius extending from the central axis 253) of the upper process station openings 734. In some configurations, the mounting elements 702 include a vertical section 714A (FIG. 8) and also a radial section 714B (FIG. 7B), which extends in a radial direction from the central axis 253.

In some embodiments, the upper support element 701 generally comprises a toroidal shaped structural element that is coupled to a second end of each of the mounting elements 702 to minimize the deflection of the chamber upper wall 616. As shown in FIGS. 7A-7B, in some configurations, the toroidal shape is not a perfect toroid and can include one or more facets (e.g., six facets shown) and one or more planar mounting surfaces (e.g., top and bottom surfaces). The upper support element 701 is coupled to each of the mounting elements 702 by bolting (i.e., bolts 703), welding, or even integrally forming the mounting elements 702 as part of the upper support element 701. The vertical section 714A of the mounting elements 702 is configured to position the upper support element 701 a distance 808 between about 150 mm and about 450 mm from the mounting surface (e.g., exposed top surface) of the chamber upper wall 616. The cross-section of the upper support element 701, as shown in FIG. 8, includes a cross-sectional height 806 and cross-sectional width 807 that is configured provide a desired added stiffness to the chamber upper wall 616, due to at least to its area moment of inertia, to support the chamber upper wall 616 and counteract the applied vacuum pressure (e.g., ~14.7 psig) induced load to minimize the distortion thereof. In one example, a three meter diameter chamber upper wall 616 receives a total of about 716,000 N (161,000 lbs) of force due to the vacuum pressure applied during processing due to the transfer region 401 being maintained, for example, at a pressure less than 1 Torr, such as between $10^{-3}$ Torr to $10^{-8}$ Torr. In some embodiments, the upper support element 701 and the mounting elements 702 are formed from the same material as the material used to form the upper monolith 722 and lower monolith 720 components (e.g., chamber upper wall 616 and lower wall 618), such as an aluminum material (e.g., 6061 Al). In some embodiments, the upper support element 701 and the mounting elements 702 are formed from a material that has a modulus of elasticity (E) that is greater than the material used to form the upper monolith 722 and lower monolith 720 components, such as an stainless steel material (e.g., 304 SST, 316 SST) and the upper monolith 722 and lower monolith 720 components are formed from an aluminum material. In one example, the upper support element 701 has a cross-sectional height 806 that is between about 50 mm and about 125 mm, a cross-sectional width 807 that is between about 75 mm and about 200 mm and has a central opening 805 that has an inner diameter that is between about 750 mm and about 900 mm. In this configuration the upper support element 701 is configured to withstand a vacuum induced load provided to the chamber upper wall 616 that includes a central opening 713 in the chamber upper wall 616 that has a diameter that is less than the inner diameter of the central opening 805, such as less than 85% of the inner diameter of the central opening 805, or less than 95% of the inner diameter of the central opening 805. In some embodiments, the combination of the structural support assembly 710 and the structure of the chamber upper wall 616 is configured minimize the angular deflection, or angular misalignment, of the processing surface 472A of a targets 472, relative to a lateral plane 801 (FIG. 8) that is parallel to the X-Y plane, to a tilt angle of between about 0.1 mm and about 0.25 mm measured edge-to-edge (e.g., rise) across a 300 mm diameter (e.g., run) that is centered about the center of a target 472 (e.g., between about 0.02 and 0.05 degree angle). In some embodiments, the combination of the structural support assembly 710 and the structure of the chamber upper wall 616 is configured minimize the angular misalignment of the processing surface 472A of a targets 472 relative to the exposed surface of a substrate S, disposed on a substrate support 672, to a tilt angle of between about 0.1 mm and about 1 mm measured edge-to-edge (e.g., rise) across a 300 mm diameter (e.g., run) of the substrate S (e.g., between about 0.02 and 0.2 degree angle). While not intending to be limiting as to the scope of the disclosure provided herein, in some cases, the angular misalignment between processing surface 472A and the lateral plane 801 can be the greatest along a radial direction extending from the central axis due to the deflection of the chamber upper wall 616 (e.g., $1^{st}$ bending mode shape).

While not shown in FIG. 8, in some embodiments, a second structural support assembly 710 is coupled to the lower wall 618 in a similar fashion as the structural support assembly 710 is coupled to the chamber upper wall 616. Thus, in some embodiments, the processing module 250 may include a first structural support assembly 710 on the chamber upper wall 616 and a second structural support assembly 710 on the lower wall 618 to improve the parallelism of the source assemblies 470 in all of the process stations 260 whether the transfer region 401 within the processing module 250 is under vacuum or at ambient pressure.

FIGS. 9A and 9B illustrate an example of an alternate configuration of a processing module 250 that includes four process stations versus the six process station configurations primarily described above. Thus, FIGS. 9A and 9B, illustrate a further processing module concept, which is a paddle robot processing module 900. In this configuration, four process stations 260 are provided, each having the same general configuration of the process stations 260 of FIGS. 2A-8 hereof, but in contrast, the four process stations are located the four corners of a rectangular enclosure 902 and the substrate supports 672A-672D do not move from one process station 260 to another process station 260, as similarly described in conjunction with FIGS. 4C-4D. The rectangular enclosure 902 includes an upper body 904 and a lower body 906 that are configured in a similar fashion as the upper monolith 722 and the lower monolith 720, which are described above. FIG. 9A includes the upper body 904 and the lower body 906 of the paddle robot processing module 900, and FIG. 9B only includes the lower body 906 portion of the paddle robot processing module 900. The upper body 904 includes a chamber upper wall that is configured to support the source assembly 470 and the process kit assembly 480 of each of the process stations 260A-260D. The lower body 906 similarly includes a lower wall that is configured to support the support chuck assemblies 590 within each of the process station 260A-260D

First and second process chamber valves 244A, 244B are located on a common one of the four walls of the paddle robot processing module 900, such that a substrate may be loaded therethrough and onto a first substrate support 672A using a robot, such as the intermediate robot 285 of FIG. 2A. Thence, the substrate support 672A is lifted to the processing position in the first process station 260A and the substrate is processed, such as by depositing a sputtered film layer thereon. Then, the substrate may be moved by a first paddle robot 908A from substrate support 672A to substrate support 672B for processing at the next process station 260B. Alternatively, a first substrate can be loaded onto the first substrate support 672A, and then moved by first paddle robot 908A to the second substrate support 672B, without being processed on the first substrate support 672A, and then a second substrate is loaded onto the first substrate support 672A for processing thereon. In a similar fashion, a second paddle robot 908B can move two additional substrates between a fourth substrate support 672D and a third substrate support 672C. The processing performed on the first and second substrates in their respective process stations, and in some cases additionally on the additional substrates in their respective process stations, can be performed simultaneously or substantially simultaneously.

Each paddle robot 908A, 908B includes a rotatable base 910A, 910B, from which extends a paddle arm 912A, 912B terminating in a paddle end effector 914A, 914B. The rotatable bases 910A, B are connected to a motor (not shown) below the rectangular enclosure, and are rotatable to position the paddle end effectors 914A, 914B over one of the respective substrate supports 672A-D. Additionally, rest stations 916A-D are positioned along the arcuate paths 995 through which the paddle end effectors 914A, 914B swing, such that a substrate may be stored at a rest station 916A-D between processing at process stations 260 or directly between the process stations 260.

Figure 10A:
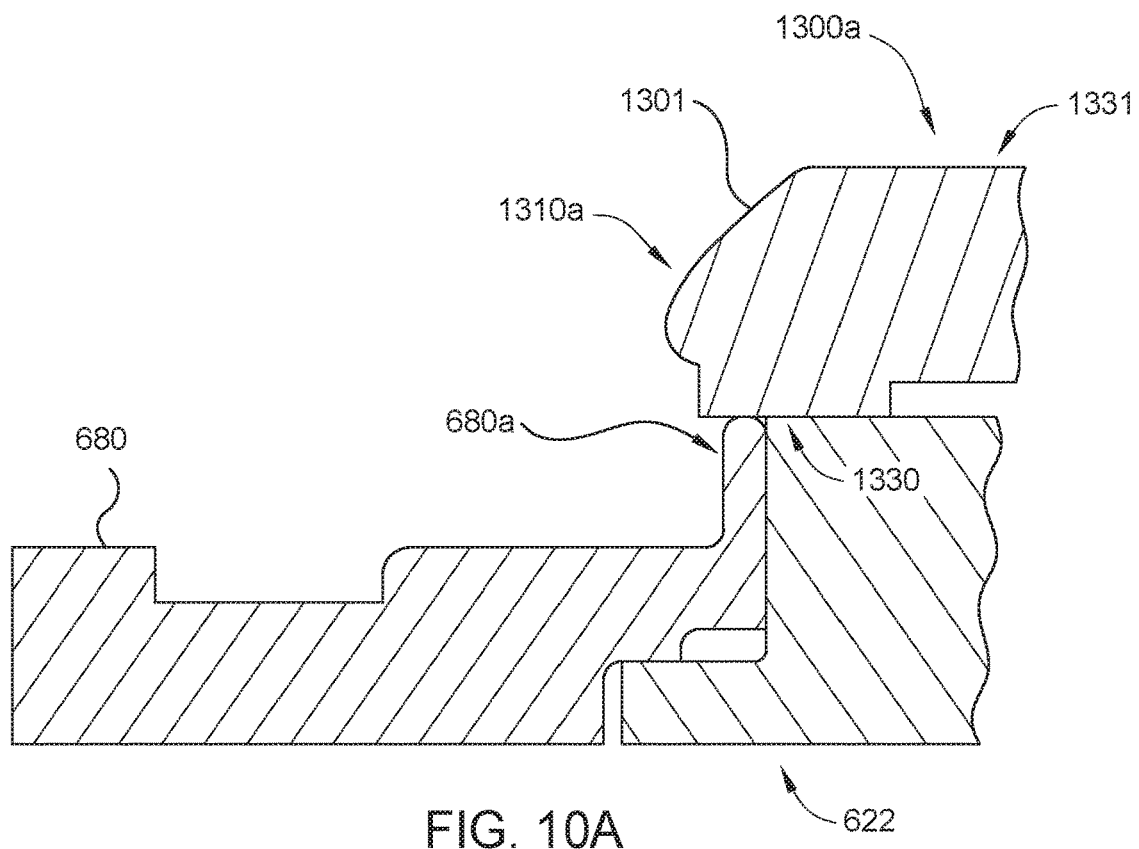
FIGS. 10A-C illustrate side views of shutter discs disposed over a skirt and an electrostatic chuck (ESC), according to some embodiments.
Figure 10B:
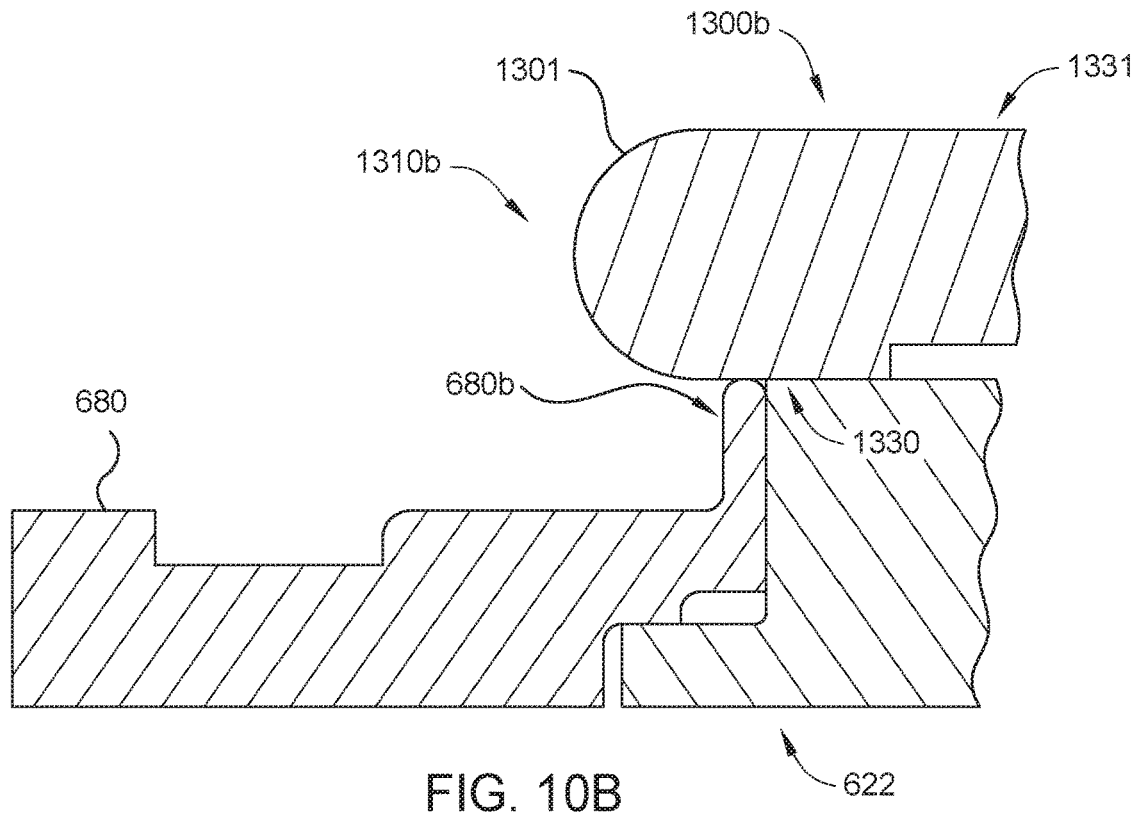
Figure 10C:
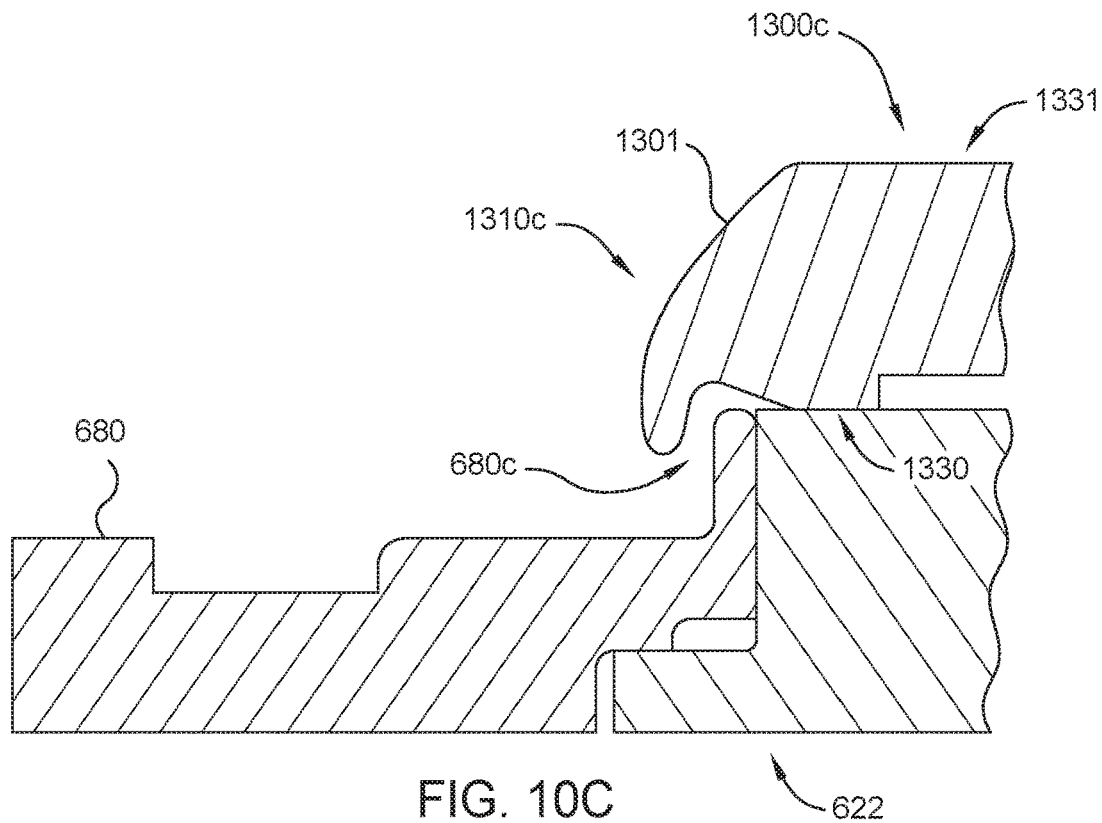

FIGS. 10A-C illustrate side views of shutter discs 1300a, 1300b, 1300c disposed over a skirt 680 and an electrostatic chuck (ESC) 622, according to some embodiments. For example, the skirt 680 can be the cover ring 486 described above in relation to FIG. 6. The skirt 680 includes skirt features 680a-c. For example, the ESC can include the body 643 described above in relation to FIG. 6.

The shutter discs 1300a, 1300b, 1300c are configured to protect underlying components (e.g., the body 643) from unwanted deposition. As shown, the shutter discs 1300a, 1300b, 1300c include a disc body 1301 and one or more disc features 1310a-c. The disc body 1301 can include any material used in the art for shutter discs, such as titanium (Ti), aluminum-silicon-carbon (AlSiC), stainless steel (SST), aluminum (Al), and any combination of the above. The disc feature 1310a (FIG. 10A) includes a rounded portion, such that the body 1301 extrudes farther from the center of the shutter disc 1300a at a bottom surface 1330 of the shutter disc than at a top surface 1331 of the shutter disc. The disc feature 1310b (FIG. 10B) includes a rounded portion, such that the body 1301 extrudes about the same distance from the center of the shutter disc 1300b at the bottom surface 1330 of the shutter disc as at the top surface 1331 of the shutter disc. The disc feature 1310c (FIG. 10C) includes a rounded portion, such that the body 1301 extrudes farther from the center of the shutter disc 1300a at the bottom surface 1330 of the shutter disc than at the top surface 1331 of the shutter disc. In addition, the disc feature 1310c includes a lip that extends below the bottom surface 1330. The disc features 1310a, 1310b, 1310c can be located uniformly around the edge of the disc body 1301, or the disc features can be located in only portions of the edge. The shutter disc includes two or more of the disc features 1310a, 1310b, according to one embodiment.

The disc features 1310a-c allow for stress reduction of the disc body 1301 during high temperature processing. For example, the disc features 1310a-c reduce stress in the disc body 1301 if the shutter discs 1300a-c undergo bowing. The shutter discs 1300a-c are sized to be placed on the ESC and the skirt such that the shutter discs still protect the ESC and the skirt if the shutter discs experience bowing. In some cases, bowing occurs due to rapid increases and/or decreases in temperature. For example, the shutter discs 1300-c are configured to withstand bowing up to about 1 mm or more. The bowing can be either toward the top surface 1331, or away from the top surface. In addition, the shutter discs 1300a-c are configured to withstand sideways (i.e., perpendicular to the bottom surface 1330 and the top surface 1331) expansion or shifting of at least a port of the body 1301 of up to about 0.5 mm or more.

Figure 10D:
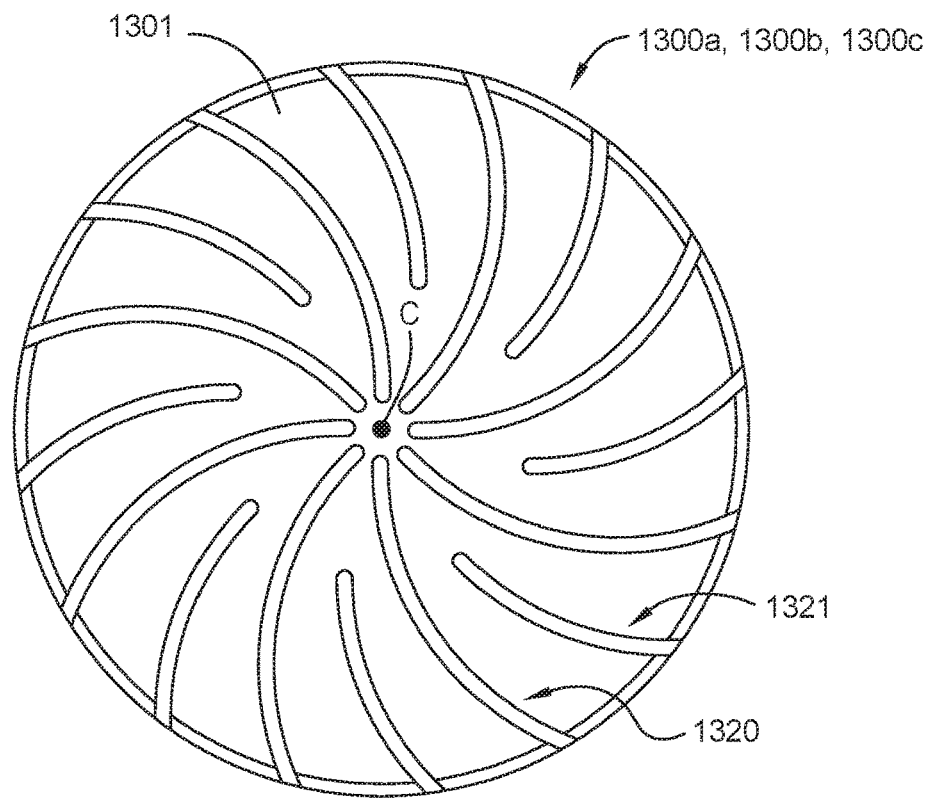
FIG. 10D illustrates a top view of a shutter disc, according to one embodiment.

FIG. 10D illustrates a top view of one of the shutter discs 1300a-c, according to some embodiments. The shutter discs 1300a-c include a plurality of long grooves 1320 that extend from the side of body 1301 to the center C of the body. The shutter discs 1300a-c include a plurality of short grooves 1321 that extend from the side of body 1301 to the center C of the body. The length of the long grooves 1320 is equal to or larger than the length of the short grooves 1321. The long grooves 1320 and the short grooves 1321 can follow any path, such as a straight path. As illustrated in FIG. 10D, the long grooves 1320 and the short grooves 1321 have an arc curve. The arc curve can have any angle, such as about 10°. The long grooves 1320 and the short grooves 1321 can have a depth of about 0.25 mm to about 0.50 mm.

The long grooves 1320 and the short grooves 1321 guide deposited material away from the components below, further protecting the components, without material being deposited in the long grooves and the short grooves themselves. The long grooves 1320 and the short grooves 1321 channel deposited material away from the components below, further protecting the components. The long grooves 1320 and the short grooves 1321 have an angular inclination with respect to deposition plane.

The shutter discs 1300a-c can have a diameter of about 300 mm or larger. The large diameter allows for protection of the underlying components even if the shutter discs 1300a-c experience bowing. This increases service life, and reduces cost of ownership, by prolonging replacement of the protected components, especially for high film thickness deposition of about 5000 nm or higher.

Figure 11A:
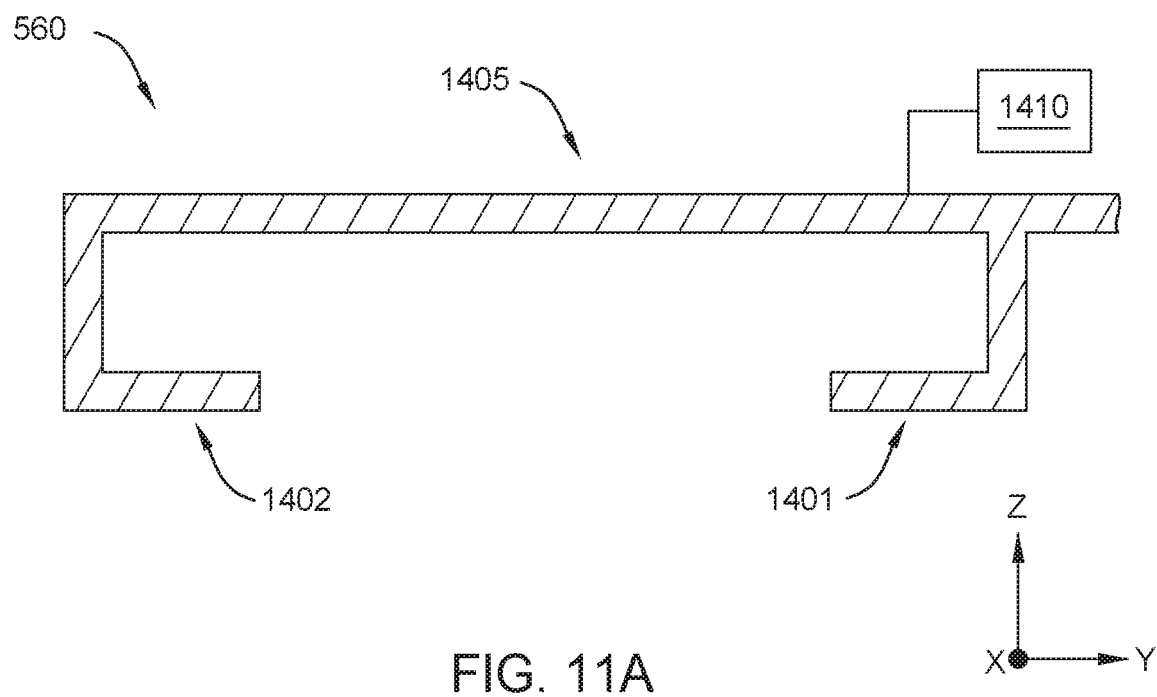
FIG. 11A illustrates a top view of a supporting portion, according to one embodiment.
Figure 11B:
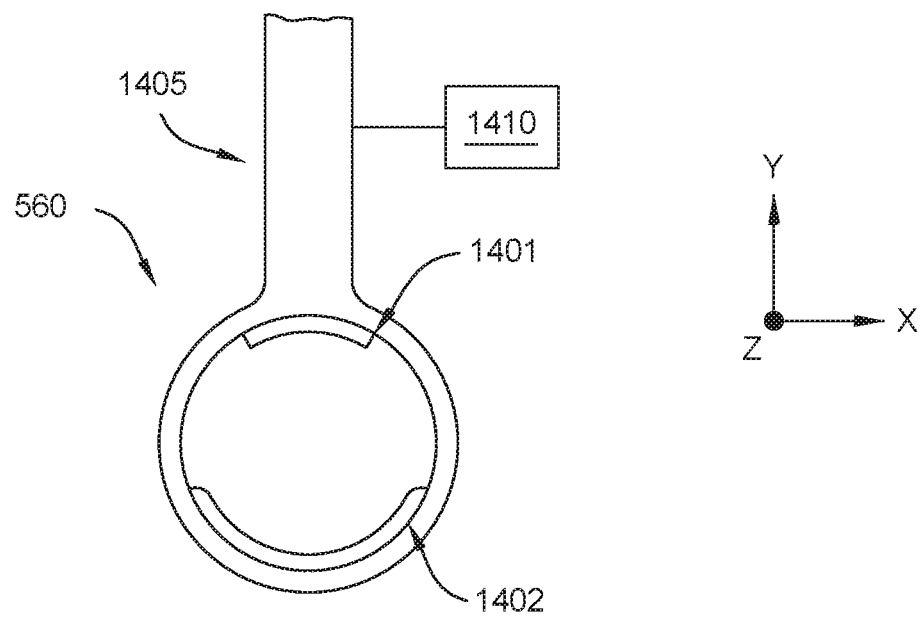
FIG. 11B illustrates a side view of a supporting portion, according to one embodiment.

FIG. 11A illustrates a side view of the supporting portion (alternatively referred to as a transfer system) 560, according to one embodiment. FIG. 11B illustrates a top view of the supporting portion 560, according to one embodiment. As shown, the supporting portion 560 includes a supporting portion body 1405, a first grasper 1401, a second grasper 1402, and a supporting portion actuator 1410. Each of the first and second graspers 1401, 1402 are coupled to the supporting portion body 1405. The first grasper 1401 and the second grasper 1402 are configured to grasp a workpiece (e.g., the substrate S or one of the shutter discs 1300a-c). The supporting portion 560 is configured to keep the rotational orientation of the workpiece constant during transfer. A constant and consistent rotational orientation of the workpiece is desirable for substrates that have layers deposited only on certain portions thereon.

In some embodiments, the first grasper 1401 and the second grasper 1402 include level surfaces such that the workpiece sits securely on the first grasper and the second grasper. In other embodiments, the first grasper 1401 and the second grasper 1402 include clasps or other mechanisms (not shown) to secure the workpiece to the supporting portion 560. The supporting portion actuator 1410 is configured to move the supporting portion 560 in the Z-direction with respect to the central support 305 (FIG. 5B). The supporting portion actuator 1410 can include any actuator used in the art, such as a pneumatic actuator, electric motor, hydraulic actuator, a step motor, a brush motor, or any other suitable actuator. In some embodiments, the entire central support 305 moves in the Z-direction, and thus the supporting portion 560 moves in the Z-direction.

Figure 11C:
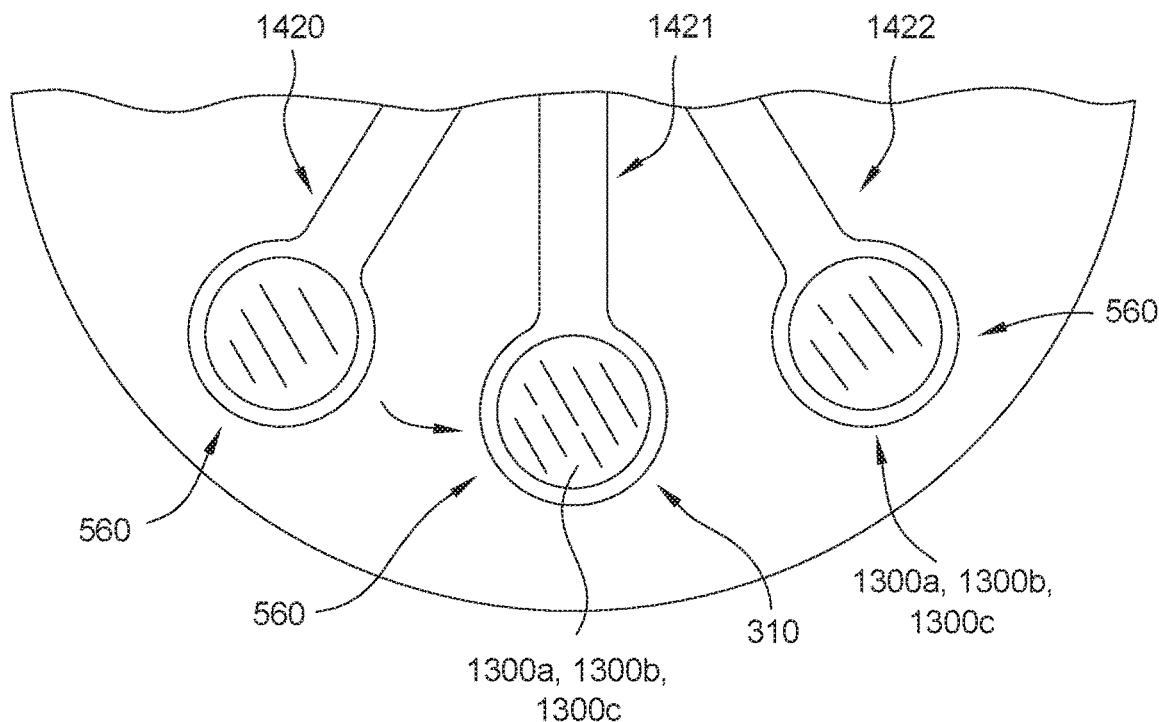
FIGS. 11C-D illustrate motion of a supporting portion, according to some embodiments.

FIG. 11C illustrates motion of the supporting portion 560, according to one embodiment. The supporting portion 560 begins at a first position 1420. In the first position 1420, the supporting portion 560 is not grasping a shutter disc or substrate.

The supporting portion 560 is then moved to a second position 1421. For example, the central transfer robot 245 (FIG. 5B) is rotated by the carousel motor 457 so that the supporting portion 560 is rotated to the second position 1421. The second position 1421 is located such that the supporting portion 560 can grasp a shutter disc (e.g., one of the shutter discs 1300a-c of FIGS. 10A-D). In some embodiments, the shutter disc is disposed in the shutter stack 310. The supporting portion actuator 1410 is configured to move the supporting portion 560 in the Z-direction in order to grasp the shutter disc. In some embodiments, the entire central support 305 moves in the Z-direction by the lift actuator 599, and thus the supporting portion 560 moves in the Z-direction in order to grasp the shutter disk.

The supporting portion 560 is then moved to a third position 1422. For example, the central transfer robot 245 (FIG. 5B) is rotated by the carousel motor 457 so that the supporting portion 560 is rotated to the third position 1422. For example, the third position 1422 is located in a processing area (e.g., process station 260). The supporting portion actuator 1410 is configured to move the supporting portion 560 in the Z-direction in order to place the shutter disc in the processing area. In some embodiments, the entire central support 305 moves in the Z-direction by the lift actuator 599, and thus the supporting portion 560 moves in the Z-direction in order to place the shutter disk.

Figure 11D:
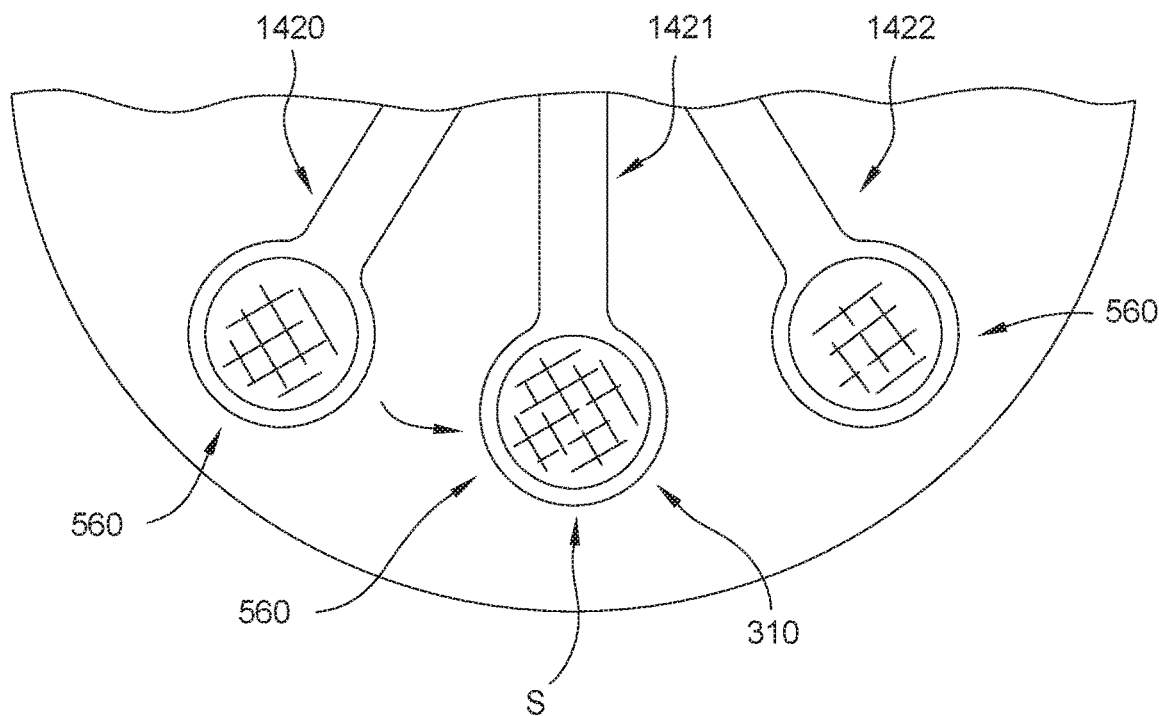

FIG. 11D illustrates motion of the supporting portion 560, according to one embodiment. The supporting portion 560 begins at a first position 1420. In the first position 1420, the supporting portion 560 is not grasping a shutter disc or substrate.

The supporting portion 560 is then moved to a second position 1421. For example, the central transfer robot 245 (FIG. 5B) is rotated by the carousel motor 457 so that the supporting portion 560 is rotated to the second position 1421. The second position 1421 is located such that the supporting portion 560 can grasp a substrate (e.g., the substrate S). In some embodiments, the substrate is disposed in the shutter stack 310. The supporting portion actuator 1410 is configured to move the supporting portion 560 in the Z-direction in order to grasp the substrate. In some embodiments, the entire central support 305 moves in the Z-direction by the lift actuator 599, and thus the supporting portion 560 moves in the Z-direction in order to grasp the substrate.

The supporting portion 560 is then moved to a third position 1422. For example, the central transfer robot 245 (FIG. 5B) is rotated so that the supporting portion 560 is rotated to the third position 1422. For example, the third position 1422 is located in a processing area (e.g., process station 260). The supporting portion actuator 1410 is configured to move the supporting portion 560 in the Z-direction in order to place the substrate in the processing area. In some embodiments, the entire central support 305 moves in the Z-direction by the lift actuator 599, and thus the supporting portion 560 moves in the Z-direction in order to place the substrate.

In either of the examples shown in FIGS. 11C and 11D, other positions can be included. For example, the supporting portion 560 is moved to four, five, or even more positions.

Each position can be located in any angle increment from about 0° to about 360°. The supporting portion 560 can move steadily from one position to another, or the outer end can move in stepwise fashion.

In some embodiments, the first position 1420 is located in a secondary processing region (e.g., another process station 260). In these embodiments, the second position 1421 can be bypassed, and thus the substrate S moves from the secondary processing region to the processing region in the second position 1421. These embodiments allow for two-step processing of substrates, firstly in the secondary processing region, and secondly in the processing region.

Figure 12A:
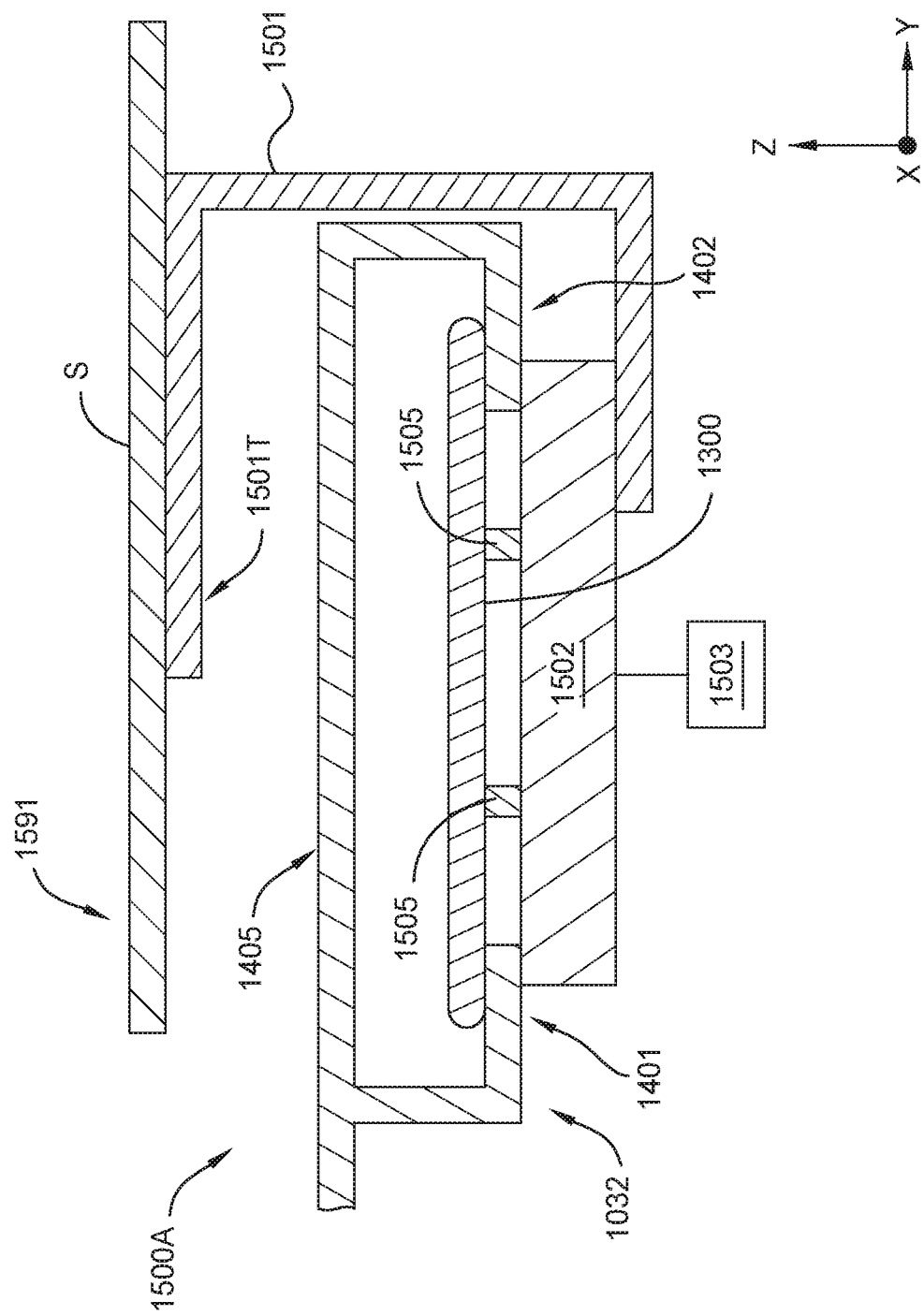
FIG. 12A illustrates a shutter stack in a first position, according to one embodiment.

FIG. 12A illustrates a shutter stack 1500A in a first position 1591, according to one embodiment. The shutter stack 1500A is configured to hold one or more shutter discs 1300 and one or more substrates S. In some embodiments, the shutter stack 1500A contains only substrates S. In some embodiments, the shutter stack 1500A includes only one or more shutter discs 1300*a-c*. The shutter stack 1500A can be used in place of the shutter stack 330 described above.

As shown, the shutter stack 1500A includes a stack base 1502, one or more shutter disc supports 1505, a substrate support 1501, and a stack actuator 1503. The one or more shutter disc supports 1505 and the substrate support 1501 are coupled to the stack base 1502. The one or more shutter disc supports 1505 are configured to support the shutter disc 1300*a-c*. The substrate support 1501 is configured to support a substrate S. The stack actuator 1503 is coupled to the stack base 1502. The stack actuator 1503 is configured to move the stack base 1502 in any desired direction. For example, the stack actuator 1503 is configured to move the stack base 1502 in the Z-direction. The stack actuator 1503 can include any actuator used in the art, such as a pneumatic actuator, electric motor, hydraulic actuator, a step motor, a brush motor, or any other suitable actuator.

Although only one set of shutter disc supports 1505 and corresponding shutter disc 1300 is shown, it is understood that the shutter stack 1500A can include any number of sets of shutter disc supports 1505 with the same number of corresponding shutter discs 1300*a-c*. Likewise, although only one substrate support 1501 and corresponding substrate S is shown, it is understood that the shutter stack 1500A can include any number of sets of substrate supports 1501 with the same number of corresponding substrates S.

In the first position 1591 illustrated in FIG. 12A, the supporting portion 560 is grasping the shutter disc 1300*a-c*. The spacing between a top portion 1501T of the substrate support 1501 and the shutter disc supports 1505 is such that the supporting portion 560 can fit between the stack base 1502 and the top portion.

Figure 12B:
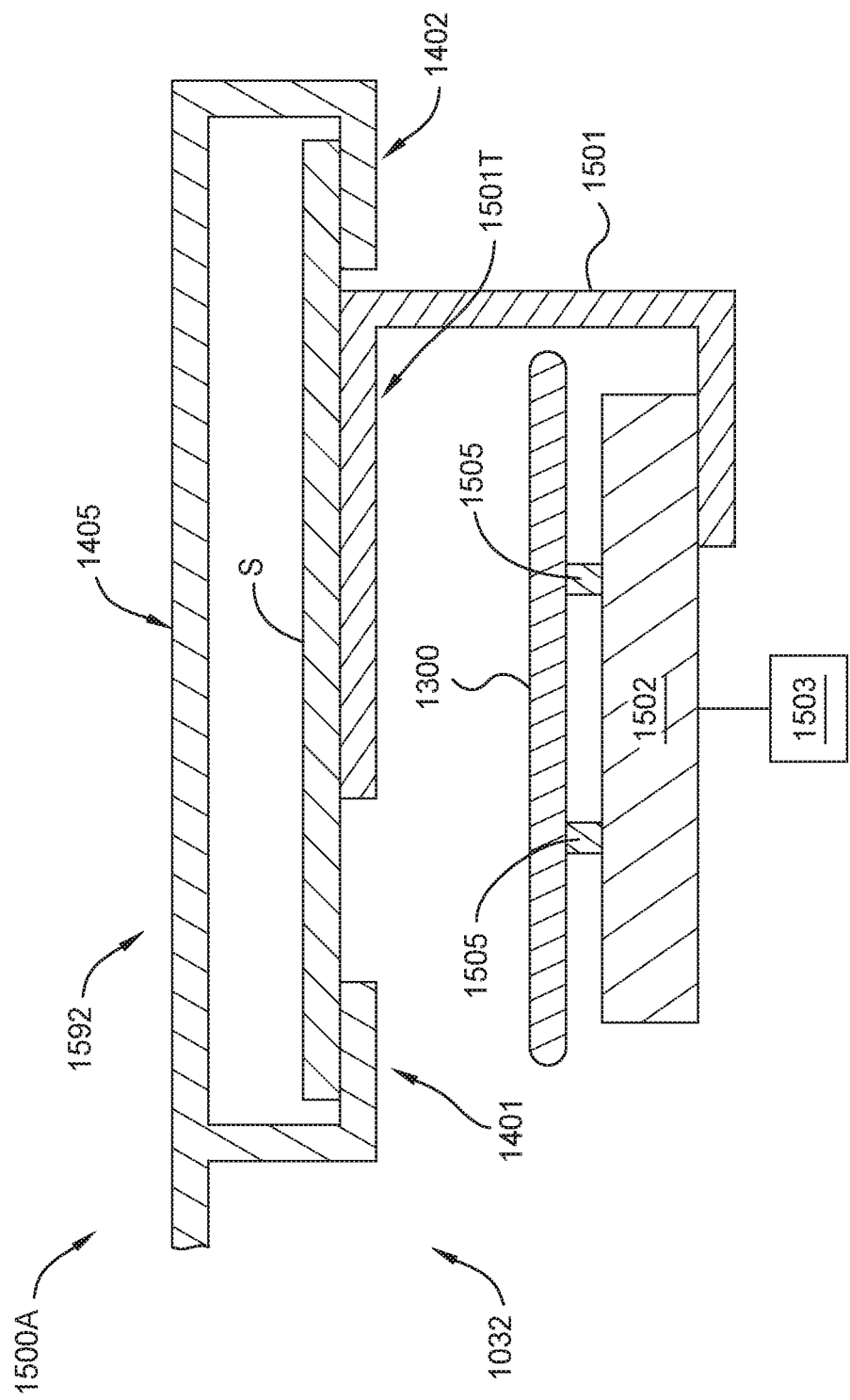
FIG. 12B illustrates a shutter stack in a second position, according to one embodiment.

FIG. 12B illustrates the shutter stack 1500A in a second position 1592, according to one embodiment. The second position 1592 is at a lower elevation compared to the first position 1591. In the second position 1592 illustrated in FIG. 12B, the supporting portion 560 is grasping the substrate S. Thus, the shutter stack 1500A is configured such that the supporting portion 560 can grasp either the substrate S or the shutter disc 1300.

Although only two positions 1591, 1592 are shown in FIGS. 12A and B, it is to be understood that any number of positions of the shutter stack 1500A are possible. For example, in configurations of the shutter stack 1500A that contain multiple substrate supports 1501, multiple positions of the shutter stack are possible, each position including the stack base 1502 at a different elevation. In addition, the shutter stack 1500A can also include lift pins (not shown), which allows for increased control of movement of the workpiece in the Z-direction.

Figure 12C:
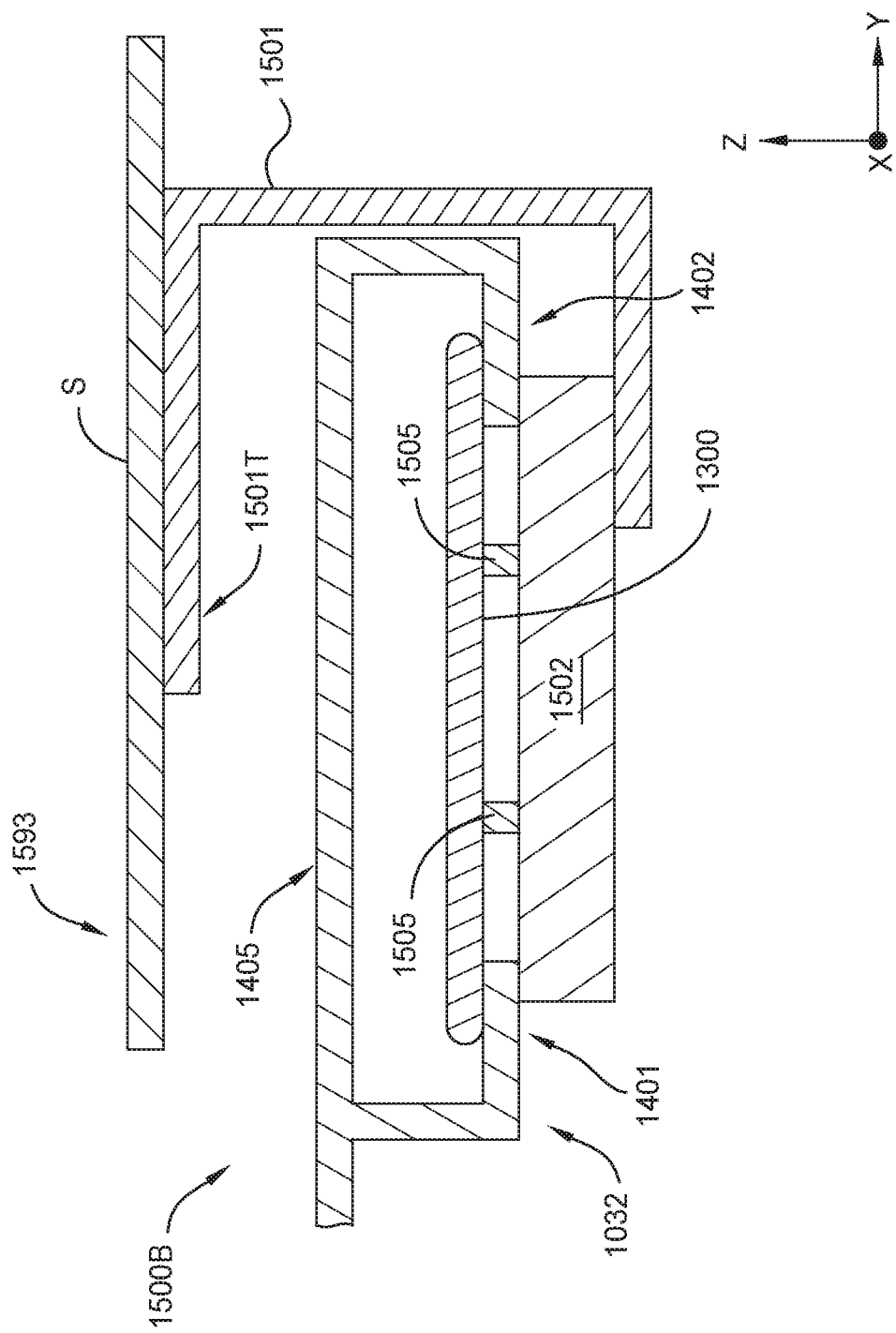
FIGS. 12C-D illustrate a shutter stack in a first position, according to some embodiments.
Figure 12D:
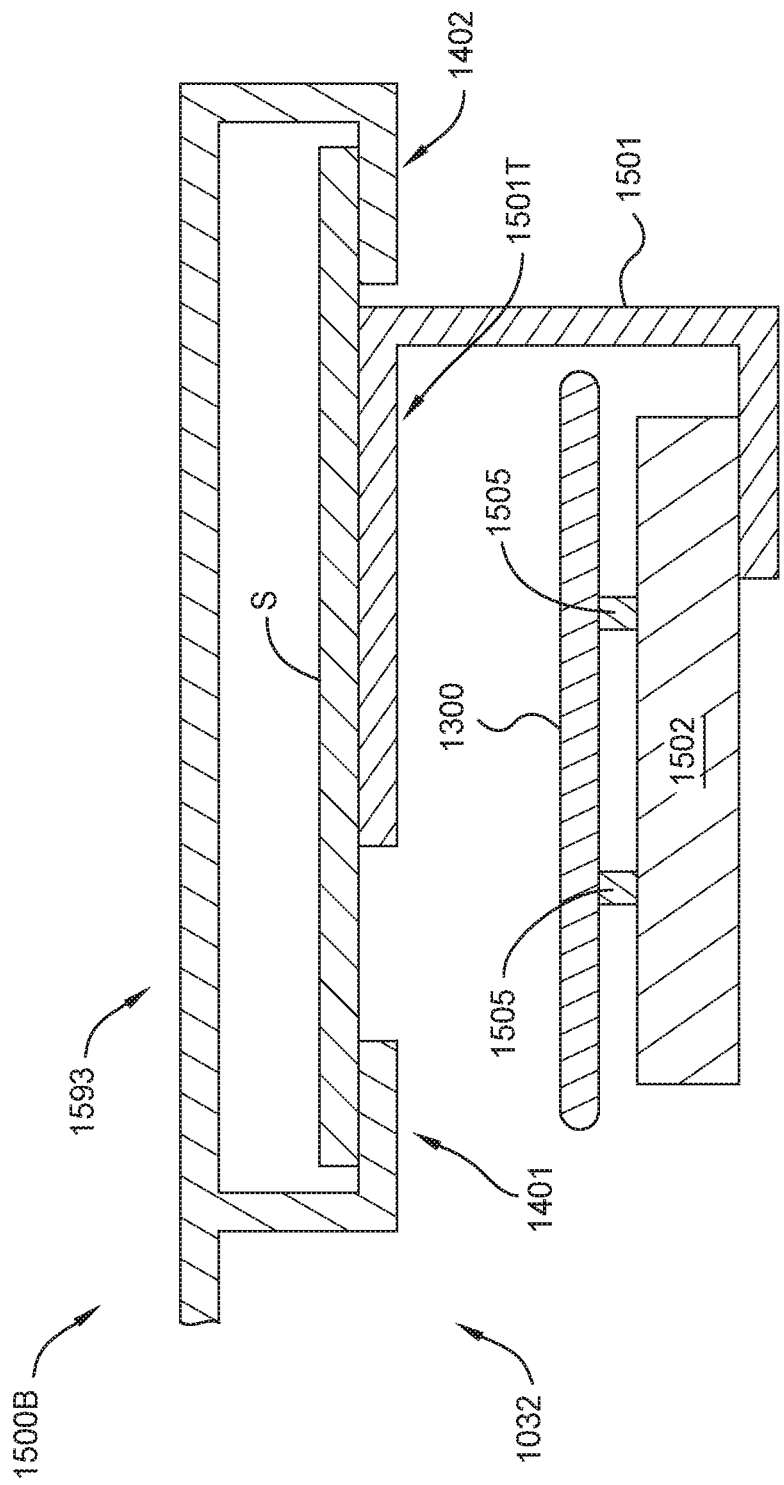

FIG. 12C illustrates a shutter stack 1500B in a first position 1593, according to one embodiment. The shutter stack 1500B can be used in place of the shutter stack 330 described above. The shutter stack 1500B is similar to the shutter stack 1500A, but the shutter stack 1500B does not include a stack actuator. That is, the shutter stack 1500B is set in a single position 1593. Instead, the supporting portion 560 moves in the Z-direction with respect to the shutter stack 1500B, as shown in FIG. 12D. For example, the supporting portion 560 is moved using the supporting portion actuator 1410 (FIGS. 11A and B). In some embodiments, the entire central support 305 moves in the Z-direction by the lift actuator 599, and thus the supporting portion 560 moves in the Z-direction. In some embodiments, the actuator of FIGS. 15C and 15D is used with the shutter stack 1500A, and thus the shutter stack and the outer end 1032 each work in concert to grasp the shutter disc 1300*a-c* and/or the substrate S.

Each of the shutter stacks 1500A, 1500B allow for retrieval of workpieces (i.e., substrates and shutter discs) without breaking vacuum. Reducing the time spent breaking and restoring vacuum increases the throughput of the cluster tool. In addition, the shutter stacks 1500A, 1500B include a cooling system, such as a radiative cooling system, according to some embodiments. The cooling system reduces the temperature of the shutter discs 1300*a-c*, increases the useful life of the shutter discs, and reduce cost-of-ownership to the user. The shutter stacks 1500A, 1500B can also include one or more sensors (not shown). The sensors indicate to the supporting portion 560 when the supporting portion is disposed in the shutter stack.

Figure 13:
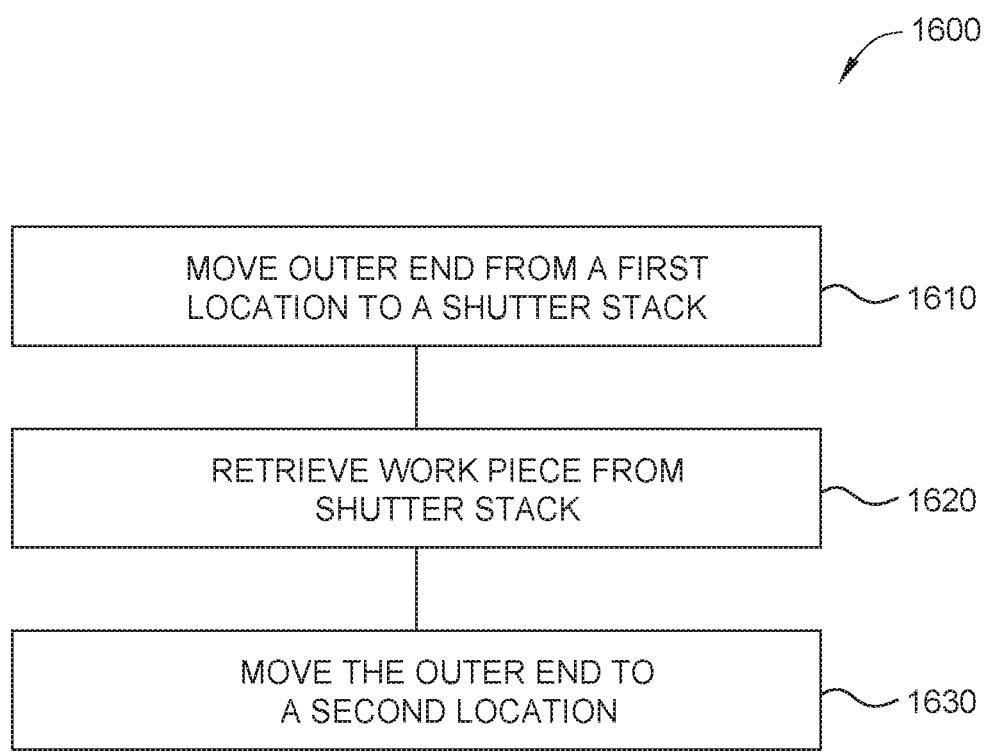
FIG. 13 is a flow diagram of method operations for moving a workpiece, according to one embodiment.

FIG. 13 is a flow diagram of method 1600 operations for moving a workpiece, according to one embodiment. Although the method 1600 operations are described in conjunction with FIGS. 11A-D, 12A-D, and 13, persons skilled in the art will understand that any system configured to perform the method operations, in any order, falls within the scope of the embodiments described herein. Embodiments of the method 1600 can be used in combination with one or more of the systems and system operations described herein, such as the substrate processing module 250 of FIGS. 2A and 2B. The method 1600 can be stored or accessible to system controller 299 of the substrate processing module 250 as computer readable media containing instructions, that when executed by a processor of the system controller, cause the transfer chamber assembly to perform the method. The entirety of the method 1600 can be performed in a vacuum environment, such as an ultrahigh vacuum (UHV) environment.

The method 1600 begins at operation 1610, where a supporting portion (e.g., supporting portion 560) is moved from a first location (e.g., first position 1420) to a shutter stack (e.g., the shutter stack 310, 1500A, or 1500B, disposed at second position 1421) in a first direction. The first direction can be a straight line, or along an arcuate path. The supporting portion is configured to grasp both a shutter disc and a substrate, according to one embodiment. The support portion is a part of a central transfer robot (e.g., central transfer robot 245), according to one embodiment.

At operation 1620, the supporting portion retrieves a workpiece (e.g., shutter disc 1300 or substrate S) from the shutter stack. Operation 1620 includes moving the supporting portion in a second direction perpendicular to the first direction, according to some embodiments. For example, the supporting portion is moved relative to the shutter stack (as shown in FIGS. 12C and D). The retrieving a workpiece includes either retrieving a shutter disc from the shutter stack, or retrieving a substrate from the shutter stack, and the retrieving the shutter disc and the retrieving the substrate are performed at a different elevation in the second direction, according to one embodiment.

Operation 1620 includes moving the shutter stack in the second direction, according to some embodiments. For example, the shutter stack is moved relative to the supporting portion (as shown in FIGS. 12A and 12B). The retrieving a workpiece includes either retrieving a shutter disc from the shutter stack, or retrieving a substrate from the shutter stack, and the retrieving the shutter disc and the retrieving the substrate are performed at a different elevation in the second direction, according to one embodiment.

In some embodiments, operation 1620 includes both moving the supporting portion in the second direction and moving the shutter stack in the second direction.

At operation 1630, the supporting portion moves to a second location (e.g., third position 1422). The second location includes a processing region (e.g., process station 260).

It is to be understood that method 1600 can be performed with a plurality of workpieces. For example, the central transfer robot includes multiple supporting portions, and thus multiple workpieces can be moved simultaneously. In addition, the method 1600 can include returning the supporting portion(s) back to previous positions (e.g., the first position 1420, the second position 1421). For example, after operation 1630, when the substrate is placed in the processing region, the supporting portion returns to the second position to retrieve a shutter disc, and the supporting portion deposits the shutter disc in the processing region.

As described above, a substrate processing module and a method of moving a workpiece are provided. The substrate processing module includes a shutter stack and two processing regions. The shutter stack is disposed between the processing regions. The method of moving a workpiece includes moving a supporting portion from a first location to a shutter stack in a first direction, retrieving the workpiece from the shutter stack, and moving the supporting portion to a second location. The substrate processing module and method allows for moving workpieces to and from the shutter stack to the two processing regions.

The central transfer robot of the substrate processing module is configured to grip both substrates and shutter discs, allowing for one robot when typically two robots would be required. The placement of the shutter stacks in a high vacuum environment reduces the need to pump up and down the vacuum when transferring substrates from the shutter stack to the processing regions.

While the foregoing is directed to embodiments of the present disclosure, other and further embodiments of the disclosure may be devised without departing from the basic scope thereof, and the scope thereof is determined by the claims that follow.

What is claimed is:

1. A substrate processing module, comprising:
   a shutter disc stack configured to store a plurality of shutter discs, the shutter disc stack comprising:
      a stack base; and
      a plurality of shutter disc supports coupled to the stack base, each of the plurality of shutter disc supports configured to support a shutter disc;
   at least two processing stations;
   a transfer robot configured to transfer at least one of the plurality of shutter discs from the shutter disc stack to each of the at least two processing stations; and
   one or more walls of the substrate processing module that define a transfer region,
   wherein the transfer robot, the shutter disc stack and at least a portion of the at least two processing stations are disposed within the transfer region of the substrate processing module, wherein the at least a portion of the at least two processing stations comprises:
      a sealing region comprising a surface of a sealing assembly that is configured to form a seal between a sealing portion of a substrate support and the surface of the sealing assembly.

2. The substrate processing module of claim 1, wherein the shutter disc stack further comprises:
   a stack actuator coupled to the stack base, the stack actuator configured to move the stack base.

3. The substrate processing module of claim 1, wherein each of the process stations comprise a source assembly.

4. The substrate processing module of claim 3, wherein the source assembly comprises a target, a magnetron assembly, a lid, and a sputtering power supply.

5. The substrate processing module of claim 1, the transfer robot further comprising one or more supporting portions, wherein each of the one or more supporting portions are configured to grasp the shutter discs.

6. The substrate processing module of claim 1, wherein
   the substrate processing module further comprises a plurality of walls that at least partially define the transfer region, wherein the plurality of walls comprise:
      a first wall that comprises an array of process station openings that surround a central axis; and
      a second wall positioned on a side of the substrate processing module that is opposite to the first wall, wherein the transfer region is disposed between the first wall and the second wall,
   the at least two processing stations are positioned on the first wall, wherein the at least two processing stations are separately disposed over a process station opening, and
   the shutter disc stack is disposed within the transfer region.

7. The substrate processing module of claim 6, wherein the at least two processing stations each comprise a substrate support actuation assembly that comprises a pedestal that is positionable by an actuator and has a supporting surface that is configured to receive a shutter disc.

8. The substrate processing module of claim 6, wherein the at least two processing stations each comprise:
   a source assembly that comprises a target and a magnetron assembly; and
   a substrate support actuation assembly that comprises a pedestal that is positionable by an actuator and has a supporting surface that is configured to receive a shutter disc.

9. The substrate processing module of claim 1, wherein the shutter disc stack further comprises the substrate support coupled to the stack base, the substrate support is configured to support a substrate.

* * * * *